United States Patent
Aoyama et al.

(10) Patent No.: US 9,507,179 B2
(45) Date of Patent: *Nov. 29, 2016

(54) QUANTUM INTERFERENCE DEVICE, ATOMIC OSCILLATOR, AND MAGNETIC SENSOR

(71) Applicant: Seiko Epson Corporation, Tokyo (JP)

(72) Inventors: Taku Aoyama, Setagaya (JP); Koji Chindo, Kawasaki (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/588,624

(22) Filed: Jan. 2, 2015

(65) Prior Publication Data

US 2015/0124307 A1    May 7, 2015

Related U.S. Application Data

(60) Division of application No. 13/541,147, filed on Jul. 3, 2012, now abandoned, which is a continuation of application No. 13/419,789, filed on Mar. 14, 2012, now Pat. No. 8,643,441, which is a continuation of application No. 12/699,350, filed on Feb. 3, 2010, now Pat. No. 8,237,514.

(30) Foreign Application Priority Data

Feb. 6, 2009 (JP) ................... 2009-025652
Jun. 29, 2009 (JP) ................... 2009-153402
Sep. 1, 2009 (JP) ................... 2009-201329

(51) Int. Cl.
*G01V 8/00* (2006.01)
*G02F 1/01* (2006.01)
(Continued)

(52) U.S. Cl.
CPC ............ *G02F 1/0126* (2013.01); *G02F 1/01* (2013.01); *H03L 7/26* (2013.01); *H01S 5/0085* (2013.01); *H01S 5/0427* (2013.01); *H01S 5/0687* (2013.01); *H01S 5/06832* (2013.01)

(58) Field of Classification Search
CPC ............ G04F 5/00; G04F 5/14; H01J 40/16; H03L 7/06; H03L 7/26; G02F 1/0126; G02F 1/01
USPC ....... 250/201.1, 354.1; 331/94.1; 372/32, 56
See application file for complete search history.

(56) References Cited

U.S. PATENT DOCUMENTS 6,320,472 B1   11/2001   Vanier
6,359,916 B1    3/2002   Zhu
(Continued)

FOREIGN PATENT DOCUMENTS

CN      1881007 A      12/2006
JP      2004-096410 A   3/2004
(Continued)

OTHER PUBLICATIONS

Zhu, M. "High Contrast Signal In A Coherent Population Trapping Based Atomic Frequency Standard Application," Proceedings of the 2003 IEEE International Frequency Contrrol Symposium and PDA Exhibition jointly with the 17th European Frequency and Time Forum. pp. 16-21.

(Continued)

*Primary Examiner* — Georgia Y Epps
*Assistant Examiner* — Kevin Wyatt
(74) *Attorney, Agent, or Firm* — Harness, Dickey & Pierce, P.L.C.

(57) ABSTRACT

A quantum interference device includes: gaseous alkali metal atoms; and a light source for causing a resonant light pair having different frequencies that keep a frequency difference equivalent to an energy difference between two ground states of the alkali metal atoms, the quantum interference device causing the alkali metal atoms and the resonant light pair to interact each other to cause an electromagnetically induced transparency phenomenon (EIT), wherein there are a plurality of the resonant light pairs, and center frequencies of the respective resonant light pairs are different from one another.

7 Claims, 22 Drawing Sheets

(51) Int. Cl.
*H03L 7/26* (2006.01)
*H01S 5/00* (2006.01)
*H01S 5/042* (2006.01)
*H01S 5/0683* (2006.01)
*H01S 5/0687* (2006.01)

(56) References Cited

U.S. PATENT DOCUMENTS

| | | | |
|---|---|---|---|
| 6,762,869 | B2 | 7/2004 | Maleki et al. |
| 7,202,751 | B2 | 4/2007 | Zhu et al. |
| 7,323,941 | B1 | 1/2008 | Happer et al. |
| 7,501,906 | B2 | 3/2009 | Dimarcq et al. |
| 2005/0068115 | A1 | 3/2005 | Atsumi et al. |
| 2005/0207456 | A1 | 9/2005 | Berberian et al. |
| 2006/0278819 | A1 | 12/2006 | Matsumoto |
| 2008/0317075 | A1* | 12/2008 | Vanier .................. G04F 5/145 372/28 |
| 2009/0256638 | A1 | 10/2009 | Rosenbluh et al. |
| 2009/0289728 | A1 | 11/2009 | Ben-Aroya et al. |
| 2010/0201452 | A1 | 8/2010 | Aoyama et al. |
| 2011/0057737 | A1* | 3/2011 | Aoyama .................. G04F 5/145 331/94.1 |
| 2011/0109395 | A1 | 5/2011 | Chindo |
| 2012/0008652 | A1* | 1/2012 | Gigioli .................. H01S 3/1303 372/32 |
| 2013/0147565 | A1* | 6/2013 | Aoyama .................. G04F 5/14 331/94.1 |

FOREIGN PATENT DOCUMENTS

| | | |
|---|---|---|
| JP | 2005-522887 A | 7/2005 |
| JP | 2005-265836 A | 9/2005 |
| JP | 2006-115513 A | 4/2006 |
| JP | 2007-530965 A | 11/2007 |
| JP | 2008-522411 A | 6/2008 |
| JP | 2008-211138 A | 9/2008 |
| JP | 2010-206767 A | 9/2010 |
| WO | WO-00-43842 A2 | 7/2000 |
| WO | WO-03-088472 A2 | 10/2003 |
| WO | WO-2006/073597 A2 | 7/2006 |

OTHER PUBLICATIONS

Guo et al., "Technology of Atomic Clocks Based on Coherent Population Trapping and Its Progress", Journal of Time and Frequency, vol. 30, No. 1, pp. 45-52, Jun. 2007.

* cited by examiner

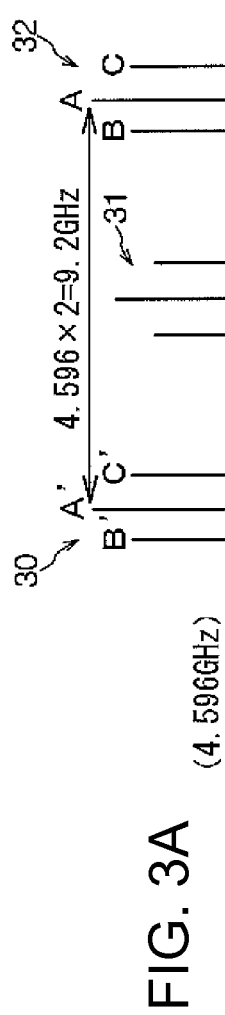
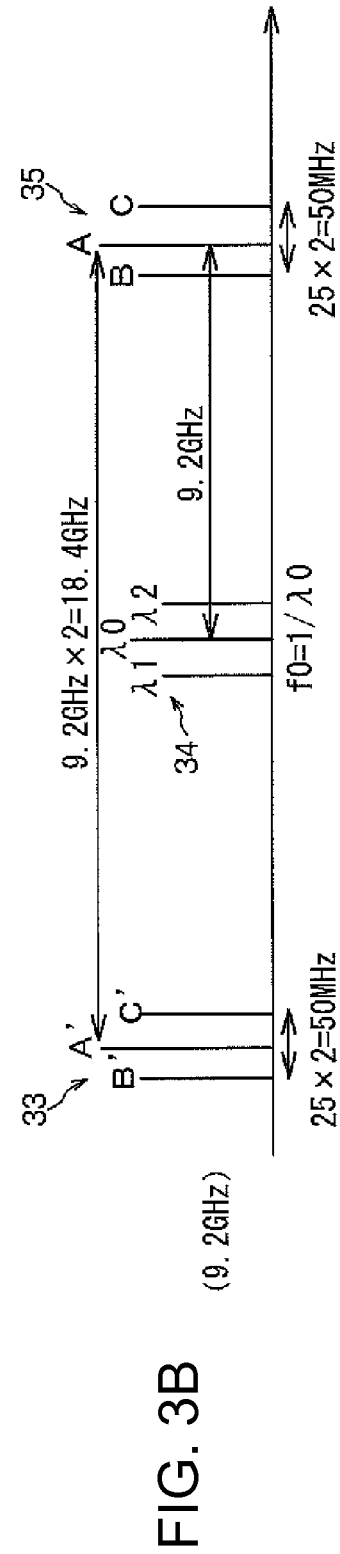
FIG. 3A (4.596GHz)
FIG. 3B (9.2GHz)

P0: LINEAR TO NONLINEAR BRANCH POINT OF LIGHT INTENSITY

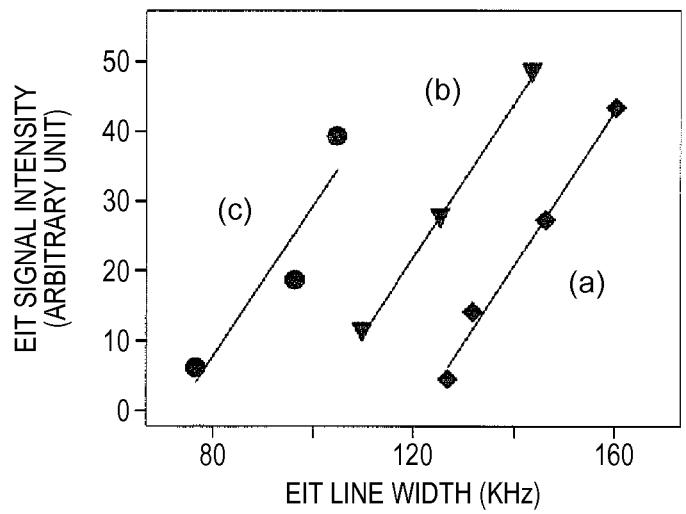

RELATION BETWEEN EIT SIGNAL INTENSITY AND LINE WIDTH
(a) COMPARATIVE EXAMPLE (METHOD IN THE PAST)
(b) PRESENT INVENTION (MODULATION AMPLITUDE = 0.2 V)
(c) PRESENT INVENTION (MODULATION AMPLITUDE = 1.0 V)

FIG.17

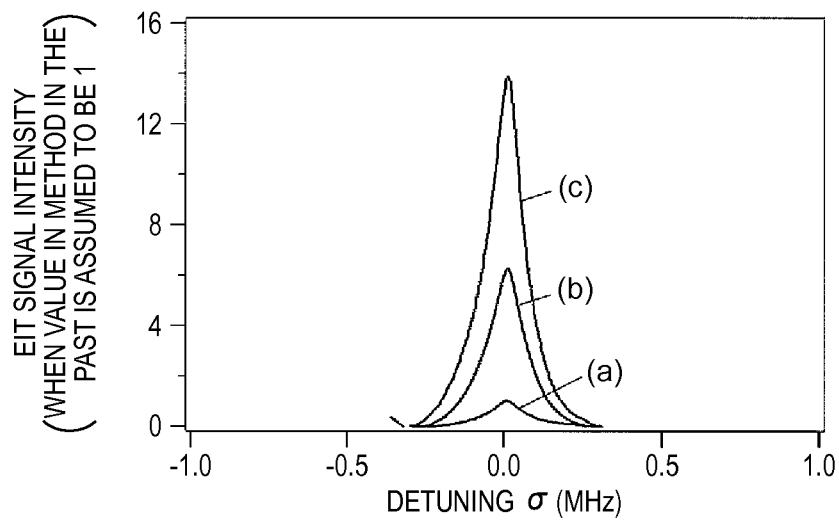

COMPARISON OF EIT SIGNAL INTENSITIES AT SAME LINE WIDTH
(a) COMPARATIVE EXAMPLE (METHOD IN THE PAST)
(b) PRESENT INVENTION (MODULATION AMPLITUDE = 0.2 V)
(c) PRESENT INVENTION (MODULATION AMPLITUDE = 1.0 V)

FIG.18

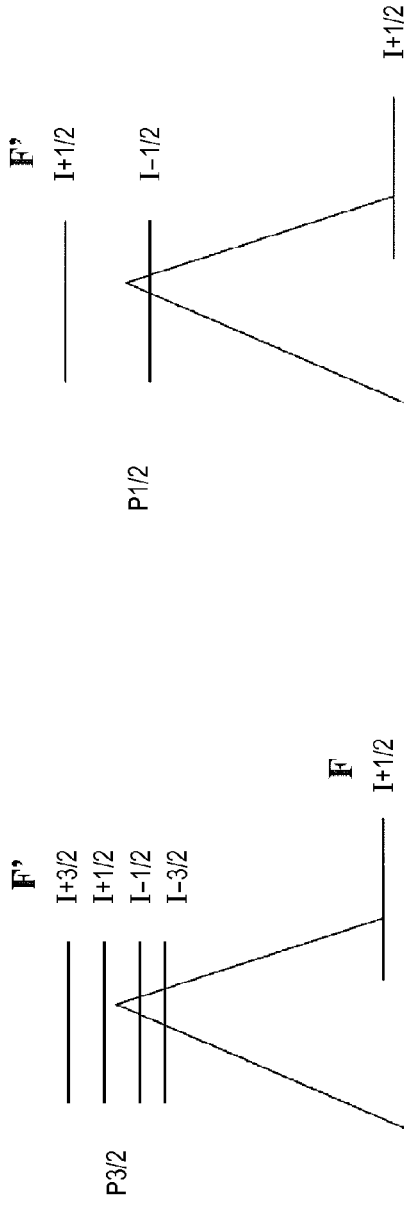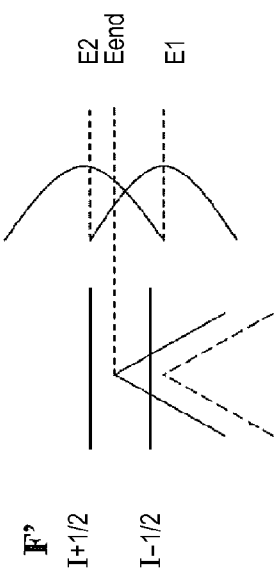

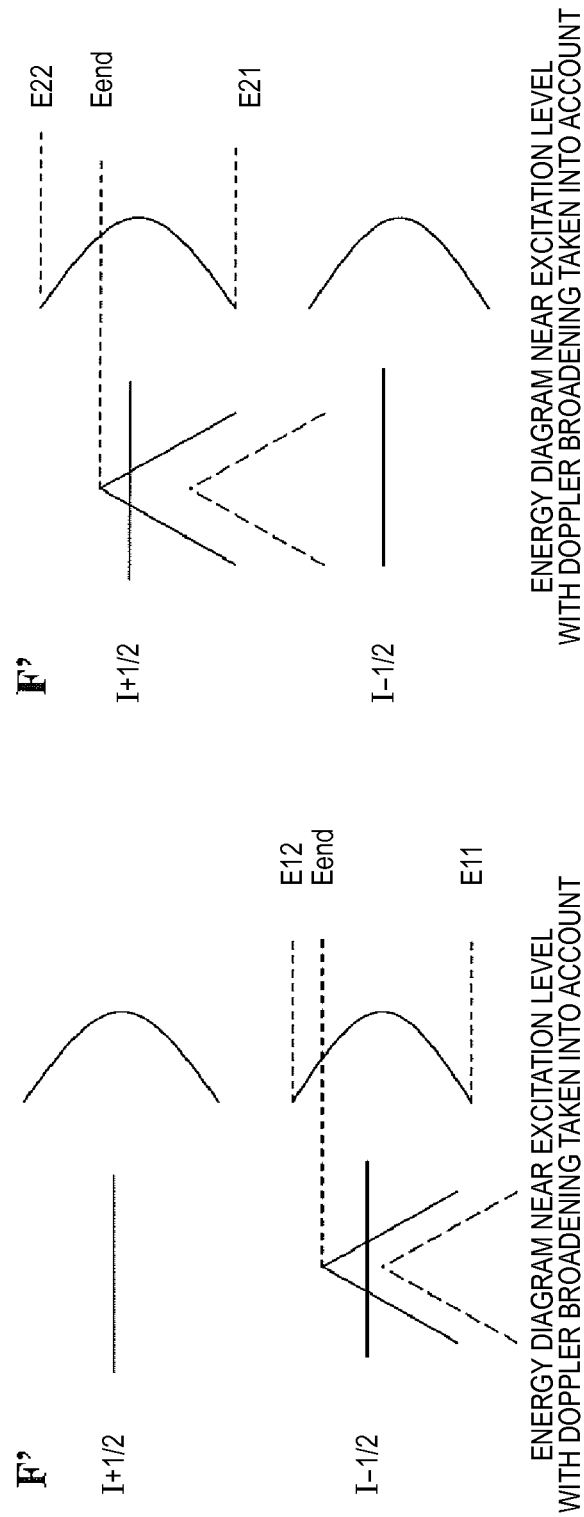

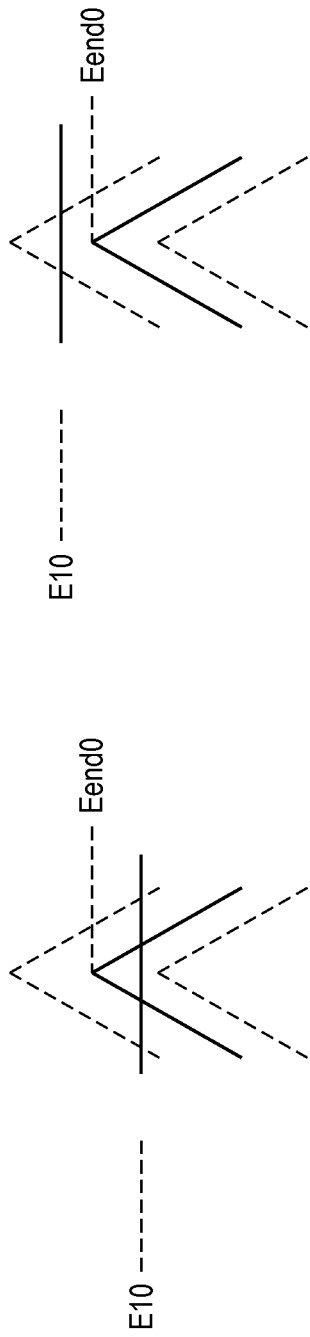
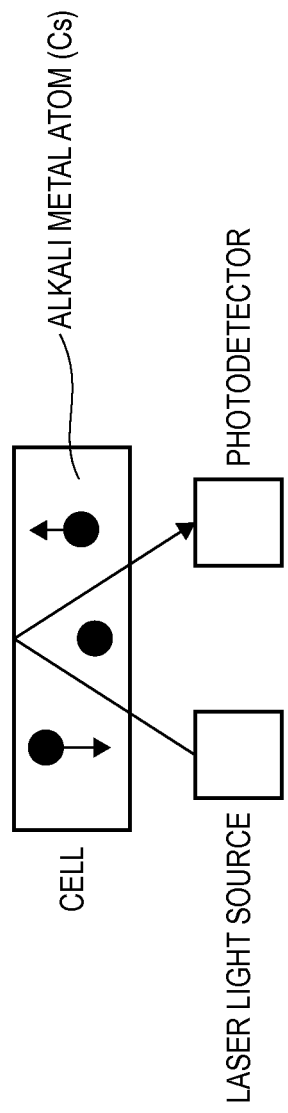
FIG.22A ENERGY DIAGRAM NEAR EXCITATION LEVEL
FIG.22B ENERGY DIAGRAM NEAR EXCITATION LEVEL
FIG.22C

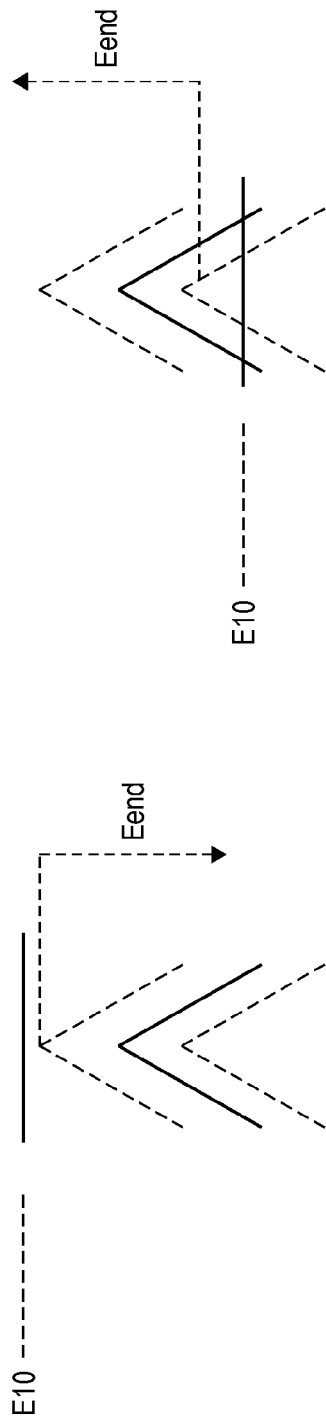
FIG.23A ENERGY DIAGRAM NEAR EXCITATION LEVEL
FIG.23B ENERGY DIAGRAM NEAR EXCITATION LEVEL
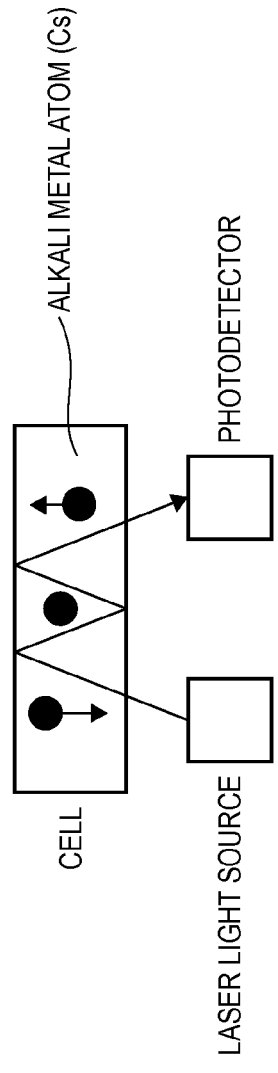
FIG.23C

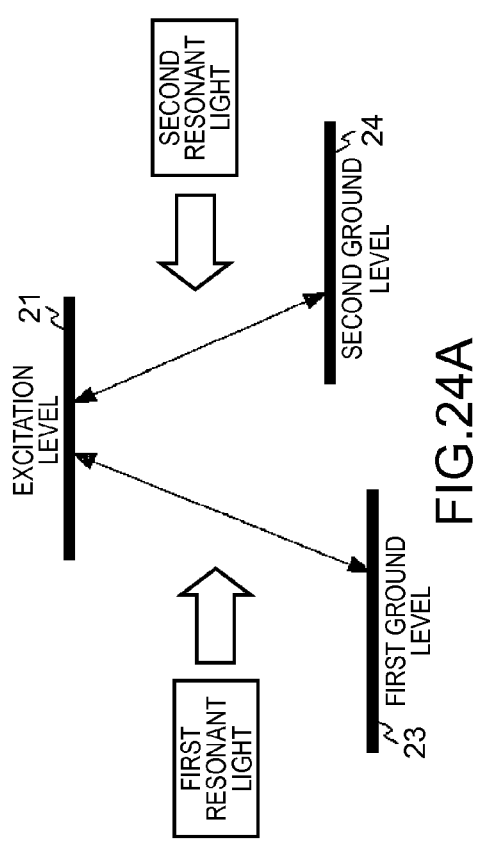
FIG.24A
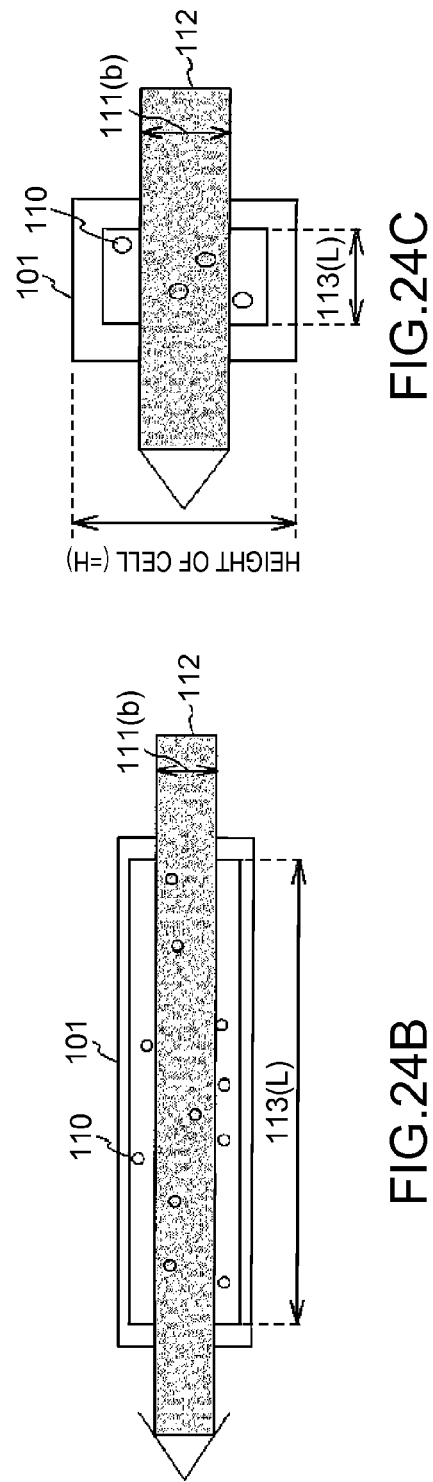
FIG.24B
FIG.24C

QUANTUM INTERFERENCE DEVICE, ATOMIC OSCILLATOR, AND MAGNETIC SENSOR

CROSS REFERENCE TO RELATED APPLICATIONS

This is a divisional application of U.S. application Ser. No. 13/541,147 filed Jul. 3, 2012, which is a continuation application of U.S. application Ser. No. 13/419,789 filed Mar. 14, 2012, now U.S. Pat. No. 8,643,441 issued Feb. 4, 2014, which is a continuation application of U.S. application Ser. No. 12/699,350 filed Feb. 3, 2010, now U.S. Pat. No. 8,237,514 issued Aug. 7, 2012, which claims priority to Japanese Patent Application No. 2009-025652, filed Feb. 6, 2009, Japanese Patent Application No. 2009-153402, filed Jun. 29, 2009, and Japanese Patent Application No. 2009-201329, filed Sep. 1, 2009 all of which are expressly incorporated by reference herein in their entireties.

BACKGROUND

1. Technical Field

The present invention relates to a quantum interference device, an atomic oscillator, and a magnetic sensor, and, more particularly to a technique for efficiently causing an EIT phenomenon.

2. Related Art

An atomic oscillator employing an electromagnetically induced transparency system (EIT system, which may be called CPT system) is an oscillator that makes use of a phenomenon in which, when two resonant lights having different wavelengths are simultaneously irradiated on alkali metal atoms, absorption of the two resonant lights stops (an EIT phenomenon). FIG. 24A is a diagram of an energy state of one alkali metal atom. When first resonant light having wavelength equivalent to an energy difference between a first ground level 23 and an excitation level 21 or second resonant light having wavelength equivalent to an energy difference between a second ground level 24 and an excitation level 21 is independently irradiated on alkali metal atoms, as it is well known, light absorption occurs. However, when the first resonant light and the second resonant light are simultaneously irradiated on the alkali metal atoms and a frequency difference between the simultaneously-irradiated first and second resonant lights precisely coincides with an energy difference (ΔE12) between the first ground level 23 and the second ground level 24, a system shown in FIG. 24A changes to a superimposed state of the two ground levels, i.e., a quantum interference state. Therefore, excitation to the excitation level 21 stops and a transparency (EIT) phenomenon occurs. It is possible to manufacture a highly-accurate oscillator by detecting, as a signal, a steep change in light absorption behavior at the time when a wavelength difference between the first resonant light and the second resonant light deviates from ΔE12 and controlling the signal making use of this phenomenon. Since ΔE12 sensitively changes because of the intensity or fluctuation of external magnetism, it is also possible to manufacture a highly-sensitive magnetic sensor making use of the EIT phenomenon.

To improve a signal-to-noise ratio (S/N) of an optical output signal due to the EIT phenomenon, the number of atoms of alkali metal, which interacts with resonant light, only has to be increased. For example, JP-A-2004-96410 (Patent Document 1) discloses, for the purpose of improving an S/N of an output signal of an atomic oscillator, a method of increasing the thickness of a cell in which gaseous alkali metal atoms are confined and a method of increasing a beam diameter of a laser beam made incident on the cell. In both the methods, to increase an area where the alkali metal atoms come into contact with resonant light, the thickness or the height of the cell is increased as shown in FIG. 24B or FIG. 24C. As the laser beam, only a pair of laser beams having two kinds of wavelength that satisfy a development condition for the EIT phenomenon are used.

U.S. Pat. No. 6,359,916 (Patent Document 2) discloses (1) a technique concerning improvement of the sensitivity of an EIT (CPT) system atomic oscillator. The technique has a characteristic that a D1 line is used as a light source. Theoretically, EIT (CPT) signal intensity can be improved compared with that in the case of a D2 line in the past. Consequently, sensitivity and frequency stability is improved. (2) The signal intensity is further improved by using a four-wave light source and causing P1/2 excitation levels (hyperfine structure), which are energy-split into two, to simultaneously interact in a double Λ type transition. The technique disclosed in the patent document relates to four wave mixing, which is on the outside of the range of the technical field related to the invention.

When attention is paid to respective atoms forming a group of gaseous alkali metal atoms in a cell, the atoms have fixed velocity distribution corresponding to motion states thereof. When laser beams having only two kinds (a pair of) wavelengths are made incident on the atom group, because of the influence of the Doppler effect (Doppler shift) due to the motion of the atoms, atoms that can actually interact one another are limited to only apart of atoms having values of specific velocity components with respect to a laser incident direction among a large number of atoms in the cell. Therefore, a ratio of atoms contributing to the EIT development is extremely low. The related art disclosed in Patent Document 1 is the atomic oscillator configured in such a state of low EIT development efficiency. Therefore, to obtain a desired absorption spectrum with a large signal-to-noise ratio (S/N), the thickness or the height of the cell has to be increased. It is difficult to reduce the size of the cell while maintaining the signal-to-noise ratio. In other words, the number of atoms contributing to the EIT phenomenon per a unit volume in the cell remains the same. The technique disclosed in Patent Document 2-(1) has the same problem.

Specifically, in both Patent Document 1 and Patent Document 2-(1), only two light waves are used. Since the alkali metal atoms in the cell have a velocity distribution, Doppler broadening of energy involved in the velocity distribution is present. Therefore, since only a part of atoms interact with one another in Λ type transition of only the two light waves, an EIT development yield per a unit volume is extremely poor. Therefore, EIT signal intensity is low.

An excitation level of existing alkali metal atoms has a hyperfine structure and is split into levels having different energies as shown in FIGS. 20A to 20C. Therefore, since the EIT phenomenon targeting the alkali metal atoms cannot be explained in a simple Λ type three-level system shown in FIG. 24A, to actually cause EIT efficiently, it is necessary to take into account such multiple levels. However, so far, sufficient examination has not been made by taking into account a relation between the presence of the multiple level and the Doppler broadening of energy involved in the atomic velocity distribution.

In particular, as in the invention, when plural resonant light pairs are used, it is important in terms of optimization of a driving condition for a quantum interference device employing the EIT phenomenon to determine a center frequency of a light source (a laser) taking into account an energy state of an excitation level and determine a modulation condition for the laser.

SUMMARY

An advantage of some aspects of the invention is to provide a quantum interference device that efficiently causes the EIT phenomenon for a larger number of gaseous alkali metal atoms in a cell by generating plural resonant light pairs having different wavelengths and provide a small atomic oscillator, a magnetic sensor, or a quantum interference sensor by making use of the quantum interference device.

The invention is devised to solve at least a part of the problems and can be realized as embodiments or application examples explained below.

Application Example 1

According to an aspect of the invention, there is provided a quantum interference device according to the invention including at least: gaseous alkali metal atoms; and a light source for causing a resonant light pair having different frequencies that keep a frequency difference equivalent to an energy difference between two ground states of the alkali metal atoms, the quantum interference device causing the alkali metal atoms and the resonant light pair to interact each other to cause an electromagnetically induced transparency phenomenon (EIT), wherein there are a plurality of the resonant light pairs, and center frequencies of the respective resonant light pairs are different from one another.

A characteristic of the quantum interference device according to the invention is that the number of excitation laser beam pairs is equal to or larger than two and center frequencies of the respective laser beam pairs are set different from one another. This makes it possible to cause the EIT phenomenon for a larger number of gaseous alkali metal atoms per a unit volume.

Application Example 2

It is preferable that the resonant light pair caused to interact with the alkali metal atoms be linearly polarized light.

When a tip of an electric vector of light draws a straight line in a plane perpendicular to a propagation direction of the light, the light is called linearly polarized light. Therefore, the resonant light pair emitted from the light source is linearly polarized light unless being subjected to polarization. A polarization state of the light can be considered as superimposition of two linearly polarized lights orthogonal to each other. Consequently, since the resonant light from the light source is originally linearly polarized light and means for polarizing the resonant light is unnecessary, it is possible to simplify the configuration of the light source.

Application Example 3

It is preferable that the resonant light pair caused to interact with the alkali metal atoms be circularly polarized light.

When a tip of an electric vector of light draws a circle in a plane perpendicular to a propagation direction of the light, the light is called circularly polarized light. It is experimentally confirmed that, when the resonant light pair is converted into the circularly polarized light, light transmission intensity of wavelength $\lambda 0$ becomes about six times as large as normal light transmission intensity. Consequently, it is possible to improve an S/N of an optical output signal due to the EIT phenomenon.

Application Example 4

It is preferable that the resonant light pair caused to interact with the alkali metal atoms be elliptically polarized light.

When a tip of an electric vector of light draws an ellipse in a plane perpendicular to a propagation direction of the light, the light is called elliptically polarized light. It is seen that, when a wave plate is placed on an optical path of the resonant light pair to be orthogonal to the optical path and the surface of the wave plate is rotated, a polarization state changes and continuously changing elliptically polarized light is present between the linearly polarized light and the circularly polarized light. Therefore, even if the light is the elliptically polarized light, it is possible to improve an S/N of an optical output signal due to the EIT phenomenon.

Application Example 5

It is preferable that a wave plate be provided on an optical path between the light source and a cell in which the alkali metal atoms are encapsulated.

The wave plate means a birefringent element that causes a phase difference between polarized light components orthogonal to each other. A wave plate that causes a phase difference $\pi$ (180°) is called a $\lambda/2$ plate or a half-wave plate, which is used for changing a polarization direction of the linearly polarized light. A wave plate that causes a phase difference $\pi/2$ (90°) is called a $\lambda/4$ plate or a quarter-wave plate, which is used for converting the linearly polarized light into the circularly polarized light (the elliptically polarized light) and for converting the circularly polarized light (the elliptically polarized light) into the linearly polarized light. In the invention, since it is necessary to convert the linearly polarized light into the circularly polarized light or the elliptically polarized light, the $\lambda/4$ plate is used. It is necessary to convert the resonant light pair of the linearly polarized light emitted from the light source into the circularly polarized light or the elliptically polarized light with the wave plate and make the resonant light pair incident on a gas cell. Consequently, it is possible to improve an S/N of an optical output signal due to the EIT phenomenon with a simple configuration.

Application Example 6

It is preferable that the plural resonant light pairs satisfy a development condition for the electromagnetically induced transparency phenomenon and the light intensities of the respective resonant light pairs be near a maximum P0 in an area in which an EIT signal intensity linearly increases.

When such a light intensity distribution of the plural resonant light pairs is adopted, it is possible to improve light use efficiency.

Application Example 7

It is preferable that an intensity distribution of the plural resonant light pairs be the Gaussian distribution with respect to center frequencies of the respective pairs, the resonant light pair corresponding to maximum light intensity satisfy a development condition for the electromagnetically induced transparency phenomenon corresponding to the atom group of alkali metal, a velocity component in the light direction of which is near 0, and the intensity be the maximum P0 in a linear area.

Since the velocity distribution of the alkali metal atoms is the Gaussian distribution, if a light intensity distribution of the resonant light pair is set to the Gaussian distribution in advance, it is possible to attain high light use efficiency with a simple optical driving circuit.

Application Example 8

It is preferable that the quantum interference device generate the plural resonant light pairs by combining amplitude modulation and frequency modulation or phase modulation.

With such a modulation system, it is possible to control the light intensity distribution of the resonant light pair at a high degree of freedom.

Application Example 9

It is preferable that the quantum interference device generate the plural resonant light pairs through modulation by a signal having any one of a sine wave, a triangular wave, a saw tooth wave, and a rectangular wave.

With such a modulation system, it is possible to control a light intensity distribution of the resonant light pair with a simple optical driving circuit at a high degree of freedom.

Application Example 10

It is preferable that the quantum interference device further include a driving circuit unit for modulating the light source and the driving circuit unit be separated from other components, and a constant of the driving circuit unit can be arbitrarily controlled and set in a state in a manufacturing process or after commercialization.

As the "quantum interference device" employing the EIT phenomenon, various applied products such as high precision oscillators, high precision measuring devices such as a clock, and quantum interference sensors such as a magnetic sensor, a particulate detection sensor for pollens and smoke are conceivable. By adopting the structure explained above, it is possible to acquire an optimum EIT signal profile corresponding to a purpose.

Application Example 11

It is preferable that, when a nuclear spin quantum number of the alkali metal atoms is represented as I, a quantum number of a hyperfine structure of an excitation level of P1/2 or an excitation level of P3/2 of the alkali metal atoms is represented as F', and minimum energy in an area in which ranges of energies with Doppler broadenings of $F'=I-1/2$ and $F'=I+1/2$ taken into account overlap with each other is represented as E1 and maximum energy thereof is represented as E2, excited energy Eend of any one of the plural resonant light pairs, which cause the electromagnetically induced transparency (EIT) phenomenon, satisfy $E1<Eend<E2$.

Atoms having velocity components in opposite directions can be simultaneously subjected to EIT development for a resonant light pair that satisfies the condition and corresponds to Eend. Therefore, power broadening (a phenomenon in which, if optical power is large, line width of an EIT signal increases) less easily occurs. Therefore, a performance index (defined later) is improved by increasing a Q value (an inverse of a half width of the EIT signal).

Application Example 12

It is preferable that, when a nuclear spin quantum number of the alkali metal atoms is represented as I and a quantum number of a hyperfine structure of an excitation level of the alkali metal atoms is represented as F', ranges of energies with Doppler broadenings of $F'=I-1/2$ and $F'=I+1/2$ taken into account do not overlap with each other, and, when a range of the energy of $F'=I-1/2$ with the Doppler broadening taken into account is set to E11 to E12 ($E11<E12$) and a range of the energy of $F'=I+1/2$ with the Doppler broadening taken into account is set to E21 to E22 ($E21<E22$), excited energy Eend of any one of the plural resonant light pairs, which cause the electromagnetically induced transparency phenomenon, satisfy one of conditions $E11<Eend<E12$ and $E21<Eend<E22$.

When the condition is satisfied, it is possible to realize EIT by the plural resonant light pairs while maintaining pure three-level system Λ type transition. Therefore, it is possible to increase an effect of enhancement of an EIT signal due to a superimposition effect.

Application Example 13

It is preferable that the quantum interference device fold the plural resonant light pairs once or plural times to cause the plural resonant light pairs to pass through the alkali metal atoms and detect the electromagnetically induced transparency phenomenon from the alkali metal atoms, and, when energy of an excitation level with Doppler width not taken into account is represented as E10 and excited energy of the plural resonant light pairs is represented as Eend0, the excited energy Eend0 satisfy $E10<Eend0$ or $Eend0<E10$.

In this case, in a forward path and a backward path of one resonant light pair, it is possible to cause EIT with alkali metal atom groups having velocity components in opposite directions in a cell. Therefore, when the EIT is caused by the plural resonant light pairs under such a condition, compared with that in a non-reflection type, an equivalent effect can be obtained with a half number of resonant light pairs for half light modulation width.

Application Example 14

It is preferable that the quantum interference device fold the plural resonant light pairs once or plural times to cause the plural resonant light pairs to pass through the alkali metal atoms and detect the electromagnetically induced transparency phenomenon from the alkali metal atom, and, when excited energy of any one of the plural resonant light pairs, which causes the electromagnetically induced transparency phenomenon, is represented as Eend, the excited energy Eend satisfy one of conditions $Eend<E10$ and $E10<Eend$.

In this case, all the resonant light pairs contribute to the EIT and are a reflection type. Therefore, compared with the non-reflection type, efficiency is higher because half the resonant light pairs only has to be used.

Application Example 15

It is preferable that the number of folds be an odd number of times (total optical path length of the forward path and the backward path be substantially equal).

When the optical path lengths of the forward path and the backward path of light are set substantially equal, the numbers of atoms contributing to the EIT in velocity groups different from each other are substantially equal. This is advantageous in terms of efficiency of EIT development.

Application Example 16

According to another aspect of the invention, there is provided an atomic oscillator including the quantum interference device according to the invention.

Since the quantum interference device according to the invention is included in the atomic oscillator, it is possible to develop the EIT phenomenon in a high S/N state. Therefore, it is possible to reduce the size of the atomic oscillator.

Application Example 17

According to still another aspect of the invention, there is provided a magnetic sensor including the quantum interference device according to the invention.

An oscillator frequency of the atomic oscillator is set with reference to an energy difference ($\Delta E12$) between two ground levels of atoms. Since a value of $\Delta E12$ changes according to the intensity or fluctuation of external magnetism, a magnetic shield is applied to cells of the atomic oscillator to prevent the cells from being affected by the external magnetism. It is possible to manufacture a magnetic sensor that measures the intensity or fluctuation of the external magnetism by removing the magnetic shield and reading a change in $\Delta E12$ from a change in the oscillation frequency. Since the magnetic sensor includes the quantum interference device, it is possible to develop the EIT phenomenon in a high S/N state. Therefore, it is possible to reduce the size of the magnetic sensor.

Application Example 18

According to still another aspect of the invention, there is provided a quantum interference sensor including the quantum interference device according to the invention.

Since the quantum interference sensor includes the quantum interference device according to the invention, it is possible to improve the sensitivity and accuracy of every sensor that detects disturbance, which affects an EIT signal profile, and reduce the size of the sensor.

BRIEF DESCRIPTION OF THE DRAWINGS

The invention will be described with reference to the accompanying drawings, wherein like numbers reference like elements.

FIGS. 3A and 3B are diagrams of frequency spectra of resonant light made incident on a gas cell.

FIG. 17 is a graph of a relation between the EIT signal intensity and line width.

FIG. 18 is a graph of comparison of the EIT signal intensity at the same line width.

FIG. 20A is an energy diagram corresponding to a D2 line.

FIG. 20B is an energy diagram corresponding to a D1 line.

FIG. 20C is an energy diagram near an excitation level with Doppler broadening taken into account.

FIG. 21A is an energy diagram near the excitation level with Doppler broadening taken into account.

FIG. 21B is an energy diagram near the excitation level with Doppler broadening taken into account.

FIG. 22A is an energy diagram near the excitation level.

FIG. 22B is an energy diagram near the excitation level.

FIG. 22C is a diagram of an arrangement configuration of a cell, in which alkali metal atoms are encapsulated, a light source, an optical path, and a detector according to a sixth embodiment of the invention.

FIG. 23A is an energy diagram near the excitation level.

FIG. 23B is an energy diagram near the excitation level.

FIG. 23C is a diagram of an arrangement configuration of a cell, in which alkali metal atoms are encapsulated, a light source, an optical path, and a detector according to a seventh embodiment of the invention.

FIG. 24A is a diagram for explaining a principle of an EIT system in the past.

FIGS. 24B and 24C are diagrams of a relation between a gas cell and resonant light in the past.

DESCRIPTION OF EXEMPLARY EMBODIMENTS

The invention is explained in detail below with reference to embodiments shown in the accompanying figures. However, components and types, combinations, shapes, relative arrangement thereof, and the like are not meant to limit a scope of the invention only thereto and are merely explanation examples unless specifically noted otherwise.

"Performance index" often referred to below is defined. The performance index is defined as a product of an inverse (i.e., a Q value) of line width of an EIT signal and an EIT signal-to-noise ratio (i.e., S/N). For example, since the S/N is proportional to EIT signal intensity, the performance index is improved if the EIT signal intensity increases. It is the principal object of the invention to improve the performance index.

Figure 1:
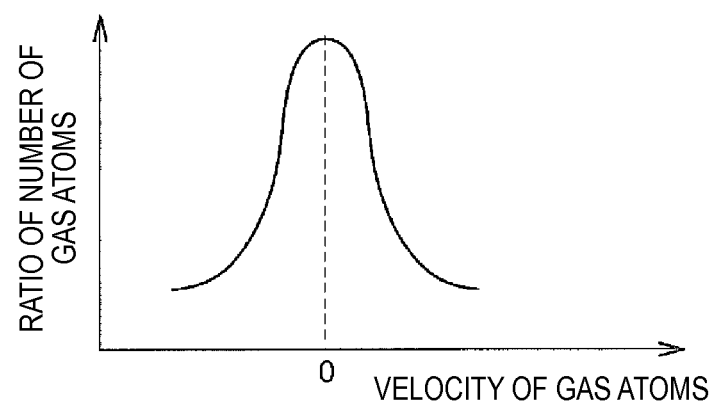
FIG. 1 is a schematic diagram of a velocity distribution of alkali metal atoms in a gaseous state.

FIG. 1 is a schematic diagram of a velocity distribution of a gaseous alkali metal atom group confined in a container.

The abscissa of FIG. 1 indicates the velocity of gaseous alkali metal atoms and the ordinate indicates a ratio of the number of gaseous alkali metal atoms having the velocity. As shown in FIG. 1, gaseous alkali metal atoms have a fixed velocity distribution corresponding to temperature with velocity 0 set in the center. The velocity represents an atomic velocity component parallel to an irradiation direction at the time when a laser beam is irradiated on the gaseous alkali metal atom group. A value of the velocity of the alkali metal atoms that is stationary relatively to the light source is set to 0. The inventors paid attention to the fact that the velocity of the gaseous alkali metal atoms substantially affected the EIT phenomenon. When there is a distribution in the velocity of the gaseous alkali metal atoms, because of Doppler effect (Doppler shift) of light, a distribution occurs in apparent wavelength of resonant light, i.e., wavelength of the resonant light viewed from the gaseous alkali metal atom. Therefore, the inventors paid attention to the fact that, in the group, there were a considerable number of gaseous alkali metal atoms that remained without causing the EIT phenomenon even if the resonant lights 1 and 2 were simultaneously irradiated as a pair. In the method in the past, i.e., when the resonant lights 1 and 2 are simultaneously irradiated on the alkali metal atom group as a pair, only a part of alkali metal atoms can contribute to the EIT phenomenon among the gaseous alkali metal atom group encapsulated in the cell. Therefore, the inventors came up with ideas for causing gaseous alkali metal atoms, which do not contribute to the EIT phenomenon and are wasted in the past due to influence of Doppler effect, to contribute to the EIT phenomenon. The invention is explained in detail below.

Figure 2:
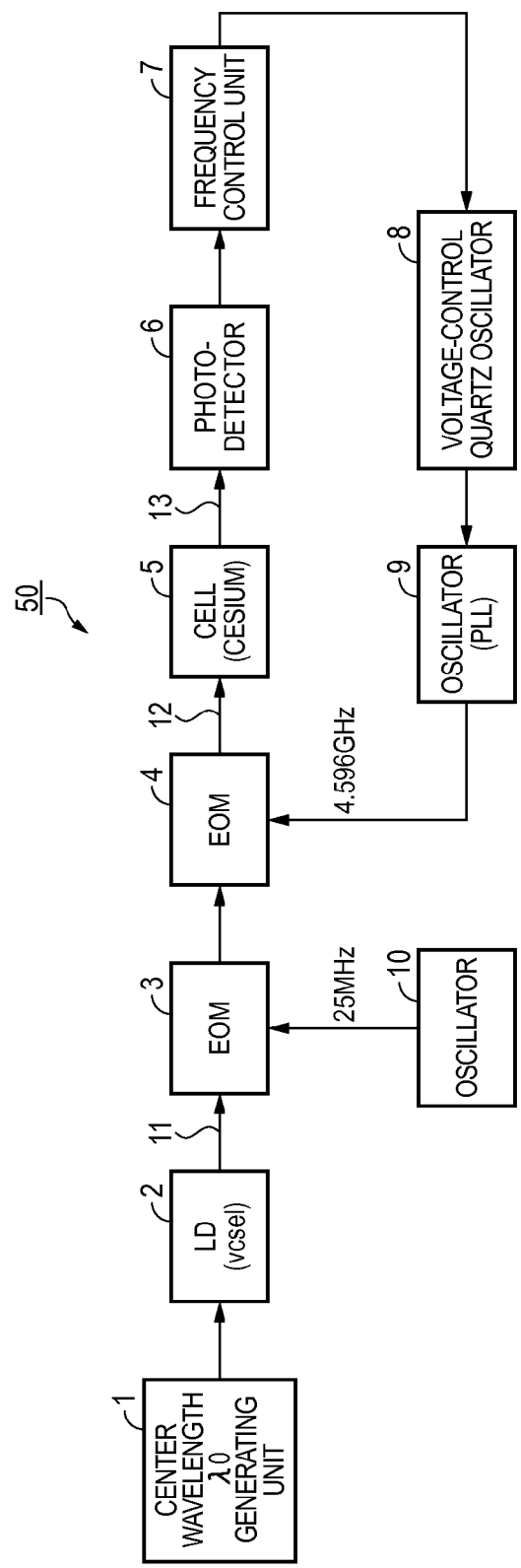
FIG. 2 is a block diagram of the configuration of an atomic oscillator according to a first embodiment of the invention.

FIG. 2 is a block diagram of the configuration of an atomic oscillator according to a first embodiment of the invention. An atomic oscillator 50 is an atomic oscillator that controls an oscillation frequency making use of a light absorption characteristic due to a quantum interference effect obtained when two or more pairs (three pairs as explained later) of resonant lights are made incident as coherent light pairs having different wavelengths. The atomic oscillator 50 includes an LD (VCSEL) (coherent light source) 2 that emits resonant lights, a center wavelength generating unit 1 that generates center wavelength of the LD 2, an oscillator 9 that oscillates a half (4.596 GHz) of a frequency (9.2 GHz) equivalent to an energy difference ($\Delta E12$) between two different ground states, an oscillator 10 that oscillates a frequency of about 25 MHz, EOMs (electro-optical modulation elements) 3 and 4 that apply frequency modulation to resonant light 11 emitted from the LD 2 according to an electric signal, a gas cell 5 encapsulated with gaseous cesium (Cs, as alkali metal) atoms that change an absorption amount of light according to wavelength of light 12 modulated by the EOM 4, a photo-detector (a light detecting unit) 6 that detects light 13 transmitted from the gas cell 5, and a frequency control unit 7 that detects an EIT state of the gas cell 5 and controls output voltage on the basis of an output of the photo-detector 6. The oscillation frequency of the oscillator 10 is set to 25 MHz. This frequency is a sufficiently small value with respect to typical Doppler width (e.g., about 1 GHz at the room temperature) of cesium atoms. The frequency can be changed as appropriate. An output frequency of the oscillator 9 is set to 4.596 GHz because the frequency equivalent to $\Delta E12$ of cesium is about 9.2 GHz (4.596 GHz×2). The output frequency is generated by multiplying a frequency obtained by controlling a voltage-control quartz oscillator 8 with control voltage output from the frequency control unit 7. The EOM 3 is modulated by the frequency (25 MHz) of the oscillator 10 and the EOM 4 is modulated by the frequency (4.596 GHz) of the oscillator 9. The EOM 3 and the EOM 4 are arranged in series on an emission side of the LD 2. A combination of the EOM 3 and the oscillator 10 and a combination of the EOM 4 and the oscillator 9 may be arranged in opposite order.

The configuration of the atomic oscillator 50 according to this embodiment is different from the configuration of the atomic oscillator in the past in that two or more pairs (three pairs) of two resonant lights having different wavelengths are obtained by modulating the resonant light 11 emitted from the LD 2 through the EOM 3 as a modulating unit. In the atomic oscillator in the past, only one pair of two resonant lights having different wavelengths is prepared and a frequency is controlled such that a frequency difference (a difference in wavelength) of two simultaneously-irradiated resonant lights accurately coincides with the energy difference $\Delta E12$ of ground levels. However, because of the Doppler effect of resonant light due to the motion of atoms, a distribution occurs in resonant light wavelengths of a cesium atom group encapsulated in the gas cell 5. One pair of resonant lights interact with only a part of the cesium atoms moving at velocity that accidentally satisfies a resonant condition corresponding to the wavelength. Therefore, efficiency of causing the EIT phenomenon is low. Therefore, in this embodiment, the light modulating unit is configured to generate at least four resonant lights (two resonant light pairs) having different wavelengths to interact with the gaseous cesium atoms encapsulated in the gas cell 5. Consequently, it is possible to increase the number of cesium atoms contributing to the EIT phenomenon per a unit volume in the gas cell 5 and efficiently acquire an EIT signal.

Figure 4:
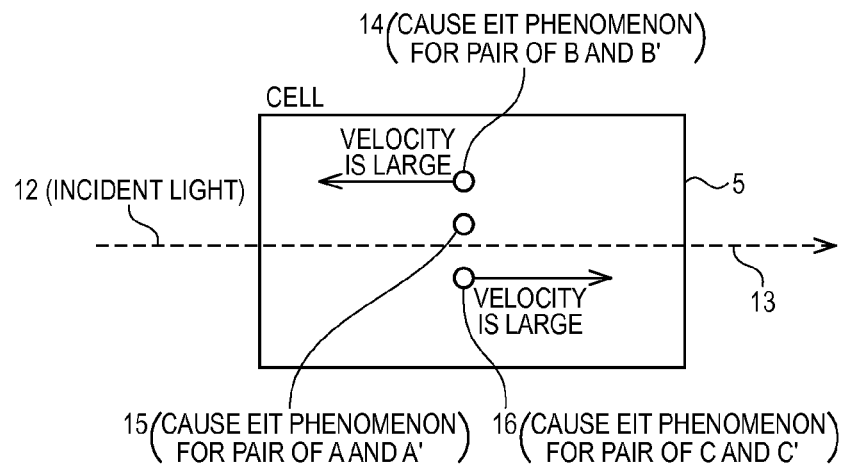
FIG. 4 is a diagram of a state of the resonant light made incident on the gas cell and moving directions of the gaseous alkali metal atoms.

FIGS. 3A and 3B are diagrams of frequency spectra of resonant light made incident on a gas cell. FIG. 4 is a diagram of a state of the resonant light made incident on the gas cell and moving directions of gaseous cesium atoms.

The operation according to this embodiment is explained below with reference to FIGS. 3A and 3B and FIG. 4. The resonant light 11 of the LD 2 is generated by the center wavelength generating unit 1 to set center wavelength to $\lambda 0$ (a center frequency f0). When the EOMs 3 and 4 apply frequency modulation to the resonant light 11 of the LD 2, the resonant light 12 having frequency spectra 30 to 32 shown in FIG. 3A is input to the gas cell 5. In FIG. 3A, a frequency difference between A and A' is 9.2 GHz. For the pair of resonant lights, gaseous cesium atoms 15 having a small velocity component with respect to a direction of the incident light 12 shown in FIG. 4 cause the EIT phenomenon when λ0 is set to an appropriate value. A frequency difference between B and B' is also 9.2 GHz. For the pair of resonant lights, gaseous cesium atoms 14 having a velocity component in a direction opposite to the direction of the incident light 12 shown in FIG. 4 causes the EIT phenomenon. In FIG. 3A, a frequency difference between C and C' is also 9.2 GHz. For the pair of resonant lights, gaseous cesium atoms 16 having a velocity component in a direction same as the direction of the incident light 12 shown in FIG. 4 cause the EIT phenomenon. In this way, the atoms in the gas cell 5 have various velocity distributions. Therefore, when the resonant light 12, to which components of sidebands B, B', C, and C' are given, is made incident on the gas cell 5 as explained above, all the frequency differences between A and A', between B and B', and between C and C' are 9.2 GHz. All the three pairs of laser beams cause interaction with gaseous cesium atoms having velocity components corresponding thereto. As a result, a ratio of cesium atoms contributing to the EIT phenomenon increases. Consequently, it is possible to obtain a desired EIT signal having a large signal-to-noise ratio (S/N).

In this embodiment, the modulation frequency of the EOM 4 is set to a half (4.596 GHz) of the frequency difference of the gaseous cesium atoms. However, the modulation frequency may be set to the frequency difference 9.2 GHz. Frequency spectra of the resonant light in that case are as shown in FIG. 3B and frequency spectra 33 to 35 are generated. However, for example, the frequency spectrum 33 is not used and the frequency spectra 34 and 35 are used (or the frequency spectrum 35 is not used and the frequency spectra 33 and 34 are used). Specifically, a frequency difference between A and λ0 is 9.2 GHz. For the pair of resonant lights, the gaseous cesium atoms 15 having the small velocity component with respect to the direction of the incident light 12 shown in FIG. 4 cause the EIT phenomenon when λ0 is set to an appropriate value. A frequency difference between B and λ1 is also 9.2 GHz. For the pair of resonant lights, the gaseous cesium atoms 14 having the velocity components in the direction opposite to the direction of the incident light 12 shown in FIG. 4 cause the EIT phenomenon. A frequency difference between C and λ2 is also 9.2 GHz. For the pair of resonant lights, the gaseous cesium atoms 16 having the velocity component in the direction same as the direction of the incident light 12 shown in FIG. 4 causes the EIT phenomenon. In this way, the atoms in the gas cell 5 have various velocity distributions. Therefore, when the resonant light 12, to which components of sidebands B, λ1, C, and λ2 are given, is made incident on the gas cell 5 as explained above, all the frequency differences between A and λ0, between B and λ1, and between C and λ2 are 9.2 GHz. All the three pairs of laser beams cause interaction with gaseous cesium atoms having velocity components corresponding thereto. As a result, a ratio of cesium atoms contributing to the EIT phenomenon increases. Consequently, it is possible to obtain a desired EIT signal having a large signal-to-noise ratio (S/N).

To generate at least two resonant light pairs (three pairs), it is conceivable to superimpose sidebands on resonant lights emitted from the LD 2 to generate resonant light pairs and use frequency spectra of the resonant light pairs. A frequency for modulating the resonant light needs to be modulated by 4.596 GHz as a half of the frequency (9.2 GHz) equivalent to the energy difference (ΔE12) of the two different ground states and a frequency (25 MHz) that is a sufficiently small value compared with the typical Doppler width (e.g., about 1 GHz at the room temperature) of cesium atoms. An EOM for modulating light is used. Therefore, in this embodiment, the oscillators 9 and 10 that respectively oscillate two kinds of frequencies are prepared. The EOMs 3 and 4 arranged in series on the emission side of the LD 2 are modulated by the respective frequencies. Consequently, it is possible to generate resonant lights having three pairs of frequency spectra, which maintain the frequency difference of 9.2 GHz, from the resonant light 11 emitted from the LD 2.

In this embodiment, one EOM 3 and one EOM 4 are provided. However, the EOM 4 and at least two EOMs 3 may be arranged in series on the emission side of the LD 2. Consequently, it is possible to set the number of resonant light pairs to an arbitrary number and generate the resonant lights at frequency intervals of a comb tooth shape.

Figure 5:
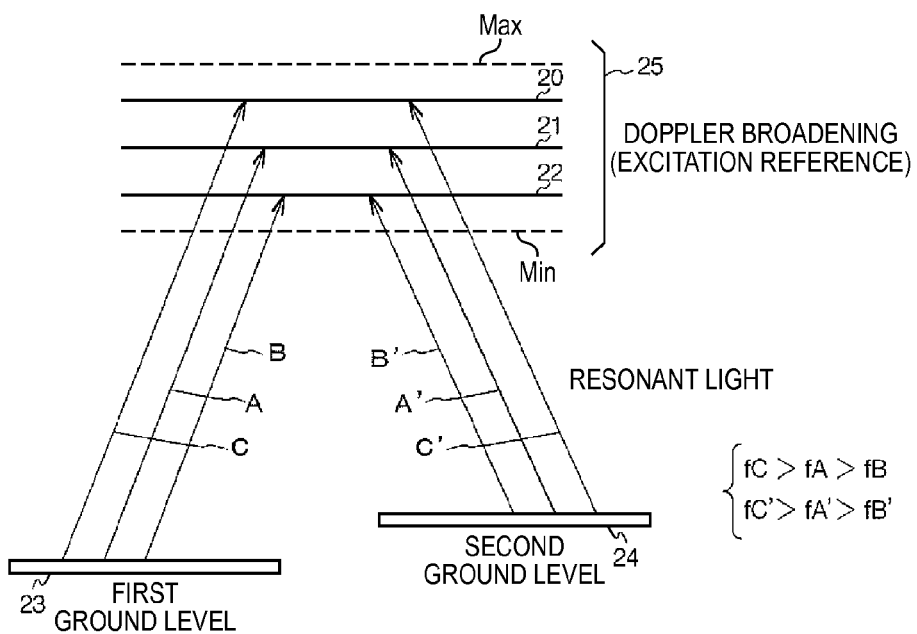
FIG. 5 is a schematic diagram for explaining a relation between Doppler broadening of energy due to the motion of atoms and resonant lights of the invention.

FIG. 5 is a schematic diagram for explaining a relation between Doppler broadening of energy due to the motion of atoms and the resonant lights of the invention. An energy state diagram of the gaseous alkali metal atom group encapsulated in the container can be represented by replacing the excitation level of the energy state diagram for one atom shown in FIG. 24 with an energy band equivalent to the Doppler broadening. Levels 20, 21, and 22 shown in FIG. 5 are respectively excitation levels corresponding to the atoms indicated by 16, 15, and 14 in FIG. 4. Consequently, it is seen that a ratio of atoms contributing to the EIT phenomenon with the plural resonant light pairs increases with respect to the gaseous alkali metal atom group having the velocity distribution. Therefore, for example, if power allocated to one pair of resonant lights is set to be substantially equal to the power in the past, since a saturation limit of absorption rises and total power increases, it is possible to obtain an EIT signal having high contrast. When total light irradiation power is substantially equal to the power in the past, power per one pair of resonant lights of the invention decreases. Therefore, power broadening of an EIT signal (a phenomenon in which the line width of the EIT signal increases when optical power is high) is suppressed. It is possible to obtain a satisfactory EIT signal having narrow half width compared with the EIT signal in the past. Therefore, when the EIT signal is applied to an oscillator, it is possible to improve frequency stability compared with the frequency stability in the past.

Figure 6:
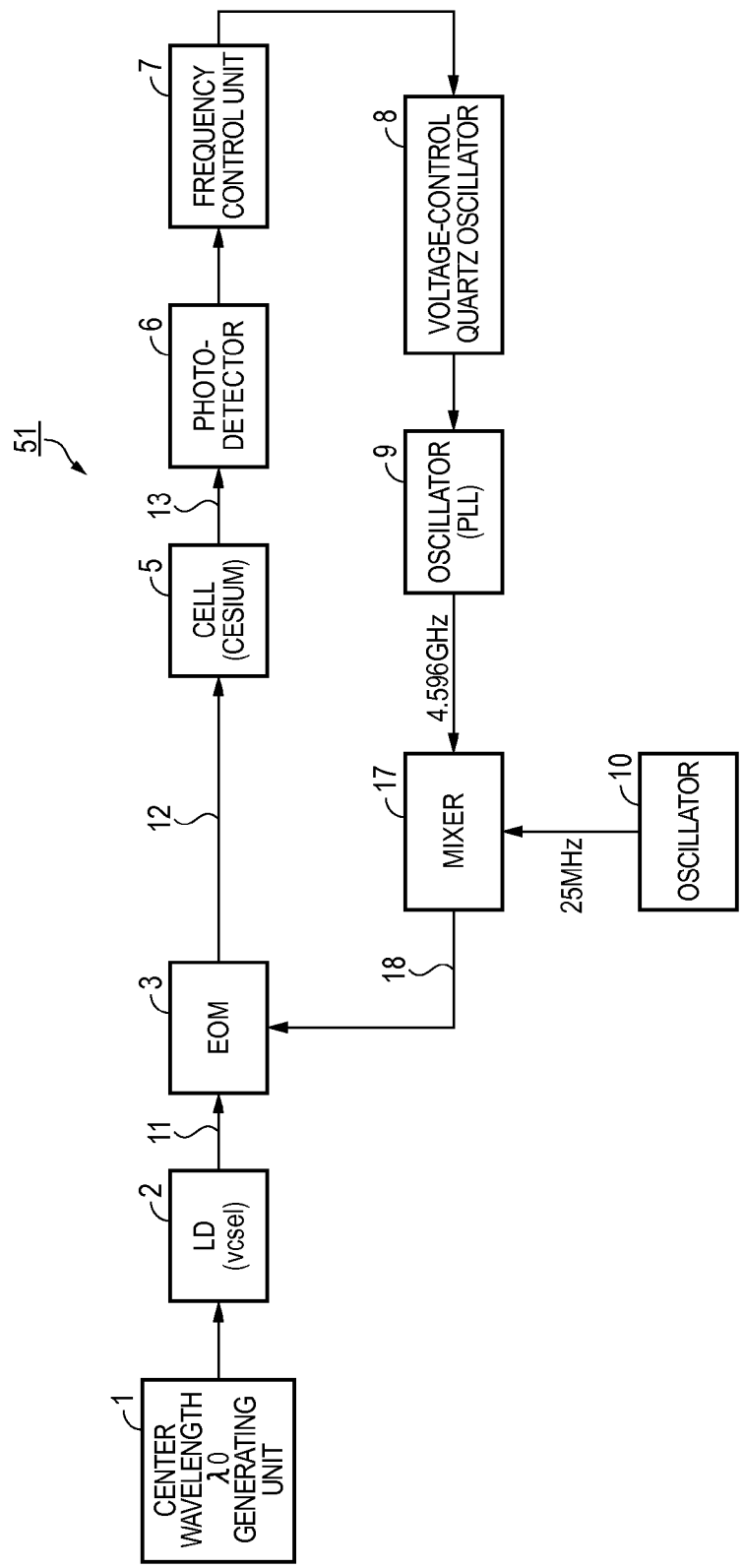
FIG. 6 is a block diagram of the configuration of an atomic oscillator according to a second embodiment of the invention.

FIG. 6 is a block diagram of the configuration of an atomic oscillator according to a second embodiment of the invention. Components same as those in the first embodiment are denoted by reference numerals same as those shown in FIG. 2 and are explained below. FIG. 6 is different from FIG. 2 in that the EOM 4 is removed, a mixer 17 that mixes output signals of the oscillators 10 and 9 is provided, the EOM 3 is driven according to an output signal 18 of the mixer 17, and the EOM 3 is arranged on the emission side of the LD 2. Consequently, the resonant light 12 emitted from the EOM 3 generates frequency spectra same as those shown in FIG. 3A.

Although the EOMs are used to modulate light, if the number of frequency spectra is increased, the number of EOMs has to be increased accordingly. As a result, cost of the atomic oscillator increases and the number of components thereof increases. Therefore, in this embodiment, signals for modulating the EOMs are mixed by the mixer 17 in advance and one EOM 3 is modulated according to the output signal 18 of the mixer 17. Consequently, it is possible to minimize the number of EOMs and reduce the number of components.

Figure 7:
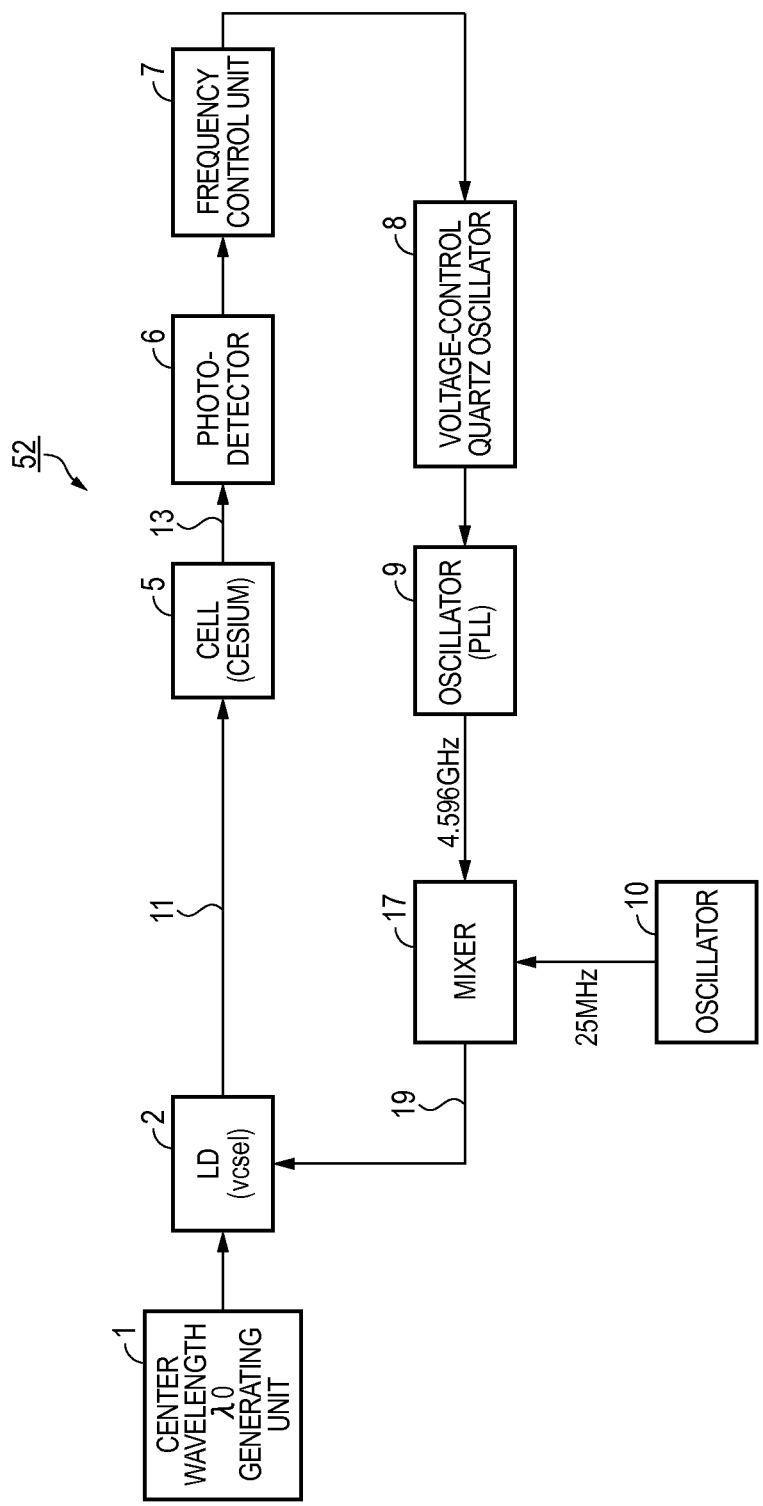
FIG. 7 is a block diagram of the configuration of an atomic oscillator according to a third embodiment of the invention.

FIG. 7 is a block diagram of the configuration of an atomic oscillator according to a third embodiment of the invention. Components same as those in the second embodiment are denoted by reference numerals same as those shown in FIG. 6 and are explained below. FIG. 7 is different from FIG. 6 in that the EOM 3 is removed and the LD 2 is directly driven to be modulated according to an output signal 19 of the mixer 17. Consequently, the resonant light 11 emitted from the LD 2 generates frequency spectra same as those shown in FIG. 3A.

Specifically, the resonant light 11 emitted from the LD 2 is generated by the center wavelength generating unit 1 to set center wavelength to λ0. To modulate the center wavelength, besides the method of modulating the resonant light 11 emitted from the LD 2 with the EOMs, there is a method of modulating the LD 2 itself. Therefore, in this embodiment, the LD 2 itself is driven to be modulated according to the signal 19 mixed by the mixer 17 that mixes the output frequencies of the oscillators 10 and 9. Consequently, it is possible to make the EOMs unnecessary. The output frequency of the oscillator 10 can also be generated from the voltage-control quartz oscillator 8 via a PLL or the like (a part of a circuit of the oscillator 9 can also be used). In that case, the oscillator 10 is also unnecessary.

Although not shown in the figure, the LD included in the atomic oscillator of the EIT system in the past may have a configuration in which surface-emitting lasers having different wavelengths are arranged in an array.

Figure 8:
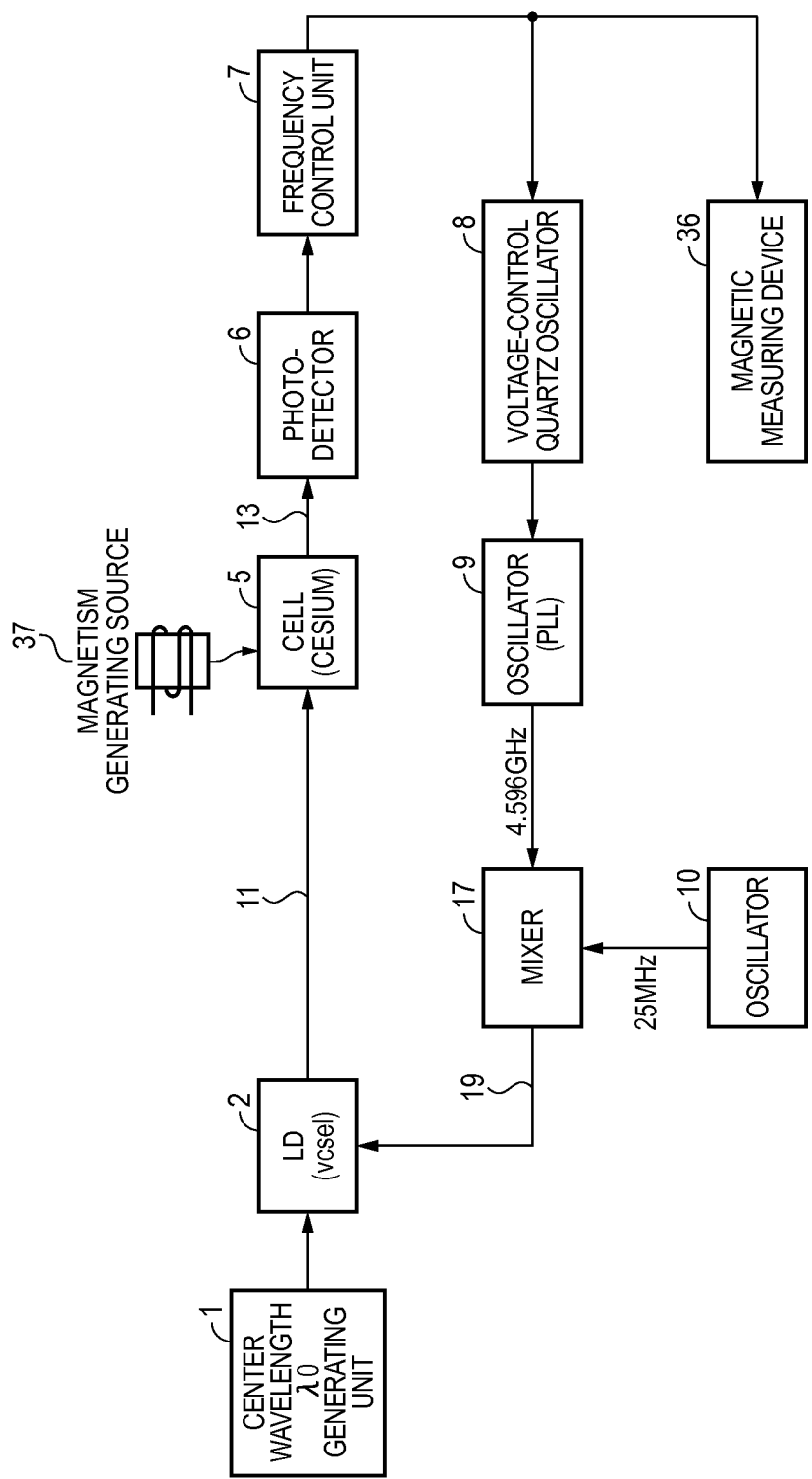
FIG. 8 is a block diagram of the configuration of a magnetic sensor according to an embodiment of the invention.

FIG. 8 is a block diagram of the configuration of a magnetic sensor according to an embodiment of the invention. Components same as those shown in FIG. 7 are denoted by reference numerals same as those shown in FIG. 7 and are explained below. FIG. 8 is different from FIG. 7 in that a measured-magnetism generating source 37 is arranged near the gas cell 5 and a magnetic measuring device 36 that measures fluctuation in an output signal of the frequency control unit 7 is provided. An oscillation frequency of the atomic oscillator is set with reference to the energy difference (ΔE12) between the two ground levels of atoms. Since a value of ΔE12 changes according to the intensity or fluctuation of external magnetism, a magnetic shield is applied to cells of the atomic oscillator to prevent the cells from being affected by the external magnetism. It is possible to manufacture a magnetic sensor that measures the intensity or fluctuation of the external magnetism by removing the magnetic shield and reading a change in ΔE12 from a change in the oscillation frequency. By adopting the configuration of the invention, it is possible to develop the EIT phenomenon in a high S/N state. Therefore, it is possible to reduce the size of the magnetic sensor.

Figure 9A:
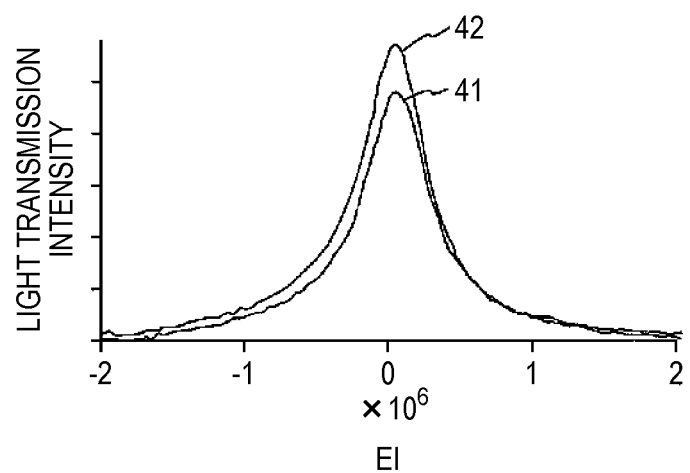
FIG. 9A is a graph of light transmission intensity related to an EIT phenomenon due to two resonant light pairs having different wavelengths.
Figure 9B:
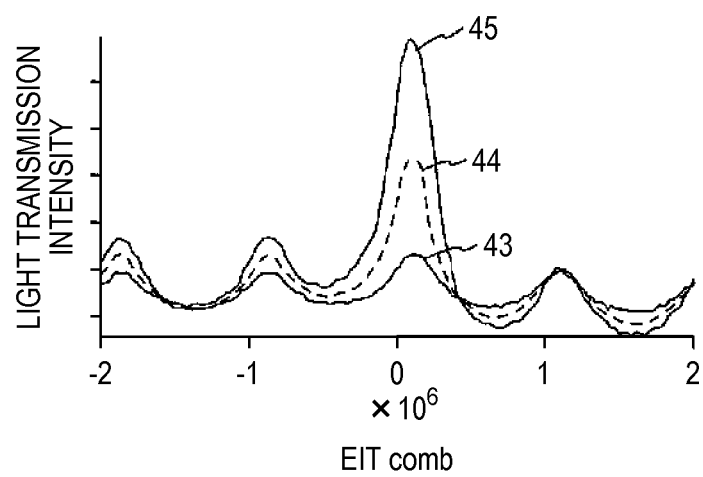
FIG. 9B is a graph of light transmission intensity related to an EIT phenomenon that occurs when the two resonant light pairs having different wavelengths are modulated.
Figure 10:
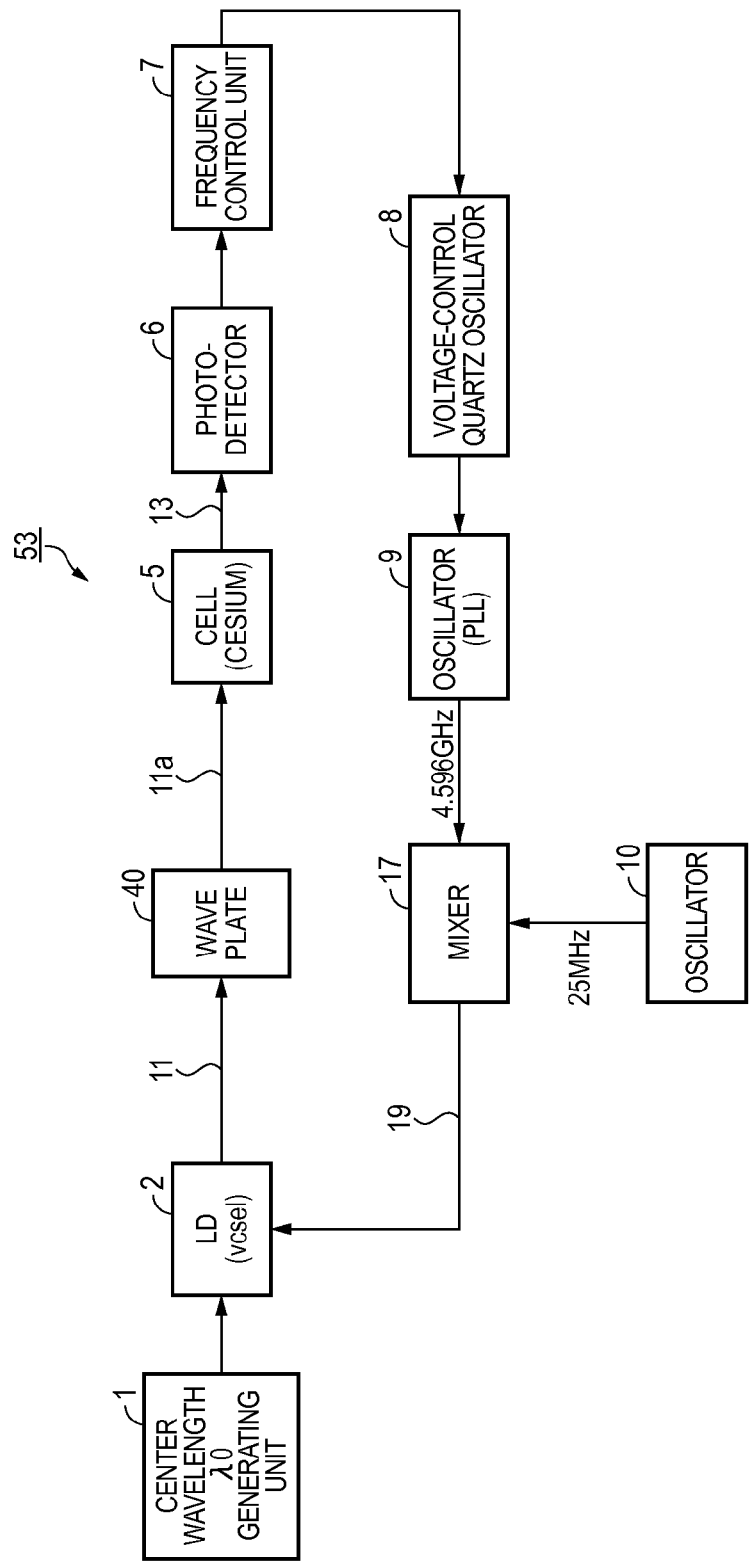
FIG. 10 is a block diagram of the configuration of an atomic oscillator according to a fourth embodiment of the invention.

FIG. 9A is a graph of light transmission intensity related to the EIT phenomenon by two resonant light pairs having different wavelengths. FIG. 9B is a graph of light transmission intensity related to the EIT phenomenon that occurs when the two resonant light pairs having different wavelength are modulated. In FIG. 9A, a waveform 41 is a waveform of light transmission intensity of linearly-polarized light from the VCSEL. Light transmission intensity obtained when the resonant light pairs are caused to further pass a wave plate and changed to circularly polarized light is a waveform 42. It is seen that the level of the waveform 42 is increased by about 20% from the level of the waveform 41. When the resonant light pairs are modulated as shown in FIG. 9B, all the plural resonant light pairs cause interaction with gaseous cesium atoms having a velocity distribution corresponding thereto and a waveform 43 having plural peaks is developed. In this embodiment, for example, a wave plate 40 is arranged between the LD 2 and the gas cell 5 to be orthogonal to an optical path as shown in FIG. 10 and a wave plate surface is gradually rotated. It was confirmed that light transmission intensity had a maximum waveform 45 at wavelength λ0 when the resonant light pair 11 changed to circularly polarized light. Therefore, it was confirmed that the light transmission intensity changed to a waveform 43 (linearly polarized light), a waveform 44 (elliptically polarized light), and a waveform 45 (circularly polarized light) in a process of changing the resonant light pair from the linearly polarized light to the circularly polarized light.

When a tip of an electric vector of light draws a circle in a plane perpendicular to a propagation direction of the light, the light is called circularly polarized light. It is experimentally confirmed that, when the resonant light pair is converted into the circularly polarized light, light transmission intensity of wavelength λ0 becomes about six times as large as normal light transmission intensity. Consequently, it is possible to improve an S/N of an optical output signal due to the EIT phenomenon.

When a tip of an electric vector of light draws an ellipse in a plane perpendicular to a propagation direction of the light, the light is called elliptically polarized light. It is seen that, when a wave plate is placed on an optical path of the resonant light pair to be orthogonal to the optical path and the surface of the wave plate is rotated, a polarization state changes and continuously changing elliptically polarized light is present between the linearly polarized light and the circularly polarized light. Therefore, even if the light is the elliptically polarized light, it is possible to improve an S/N of an optical output signal due to the EIT phenomenon.

FIG. 10 is a diagram of the configuration of an atomic oscillator according to a fourth embodiment of the invention. In the fourth embodiment, the wave plate 40 is added to the configuration shown in FIG. 7. Specifically, the wave plate 40 is arranged between the LD 2 and the cell 5 to be orthogonal to the optical path. The resonant light pair 11 of the linearly polarized light emitted from the LD 2 is made incident on the wave plate 40 and changes to circularly polarized light 11a with a phase thereof polarized by 90 degrees. The wave plate 40 may be arranged anywhere between the LD 2 and the cell 5 and may be arranged near an emission surface of the LD 2 or near an incident port of the cell 5.

Figure 11:
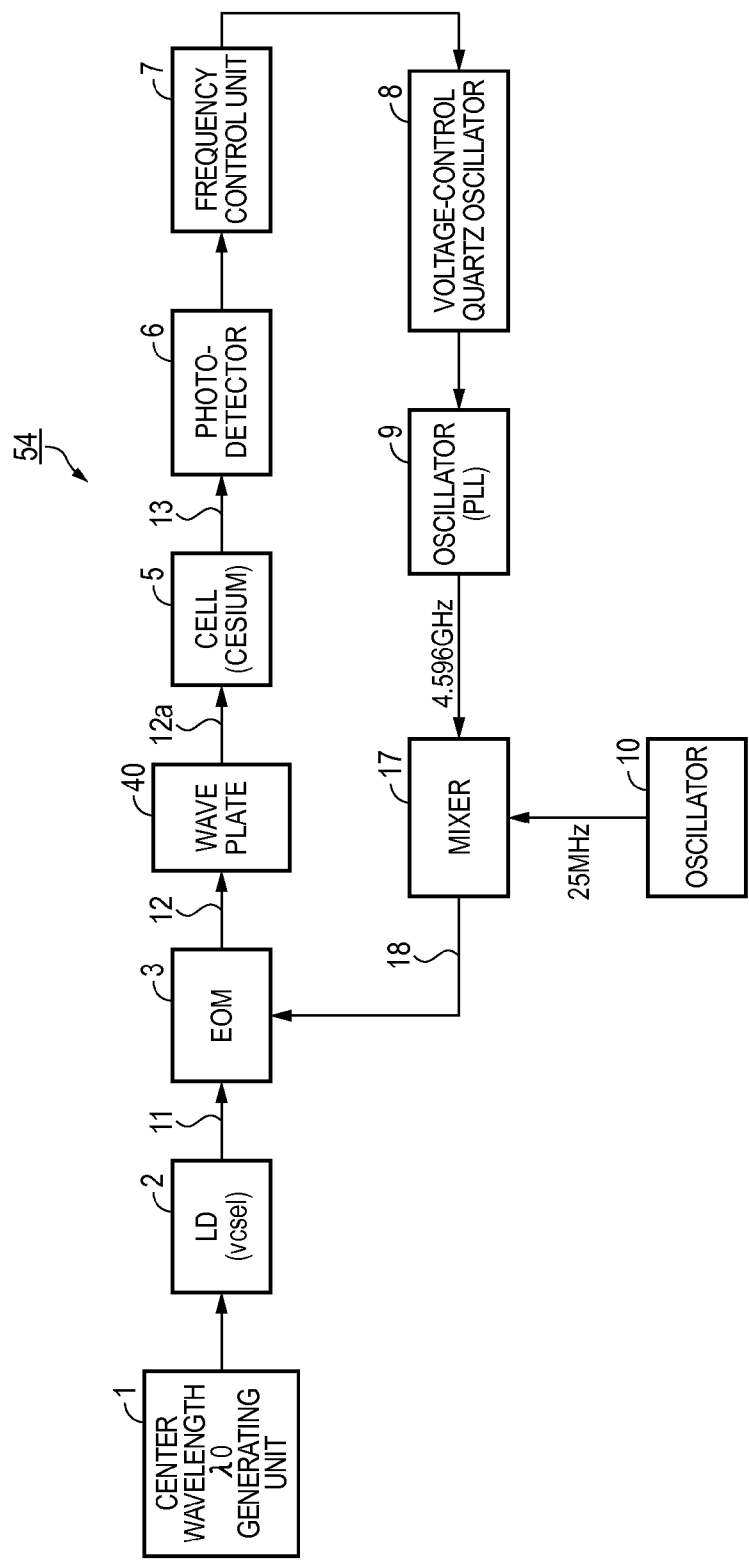
FIG. 11 is a block diagram of the configuration of an atomic oscillator according to a fifth embodiment of the invention.

FIG. 11 is a block diagram of the configuration of an atomic oscillator according to a fifth embodiment of the invention. In the fifth embodiment, the wave plate 40 is added to the configuration shown in FIG. 6. Specifically, the wave plate 40 is arranged between the EOM 3 and the cell 5 to be orthogonal to the optical path. The resonant light pair 11 of the linearly polarized light emitted from the LD 2 is modulated by the EOM 3 into the resonant light 12, made incident on the wave plate 40, and changes to circularly polarized light 12a with a phase thereof polarized by 90 degrees. The wave plate 40 may be arranged anywhere between the EOM 3 and the cell 5 and may be arranged near an emission surface of the EOM 3 and near the incident port of the cell 5.

The wave plate means a birefringent element that causes a phase difference between polarized light components orthogonal to each other. A wave plate that causes a phase difference π (180°) is called a λ/2 plate or a half-wave plate, which is used for changing a polarization direction of the linearly polarized light. A wave plate that causes a phase difference $\pi/2$ (90°) is called a $\lambda/4$ plate or a quarter-wave plate, which is used for converting the linearly polarized light into the circularly polarized light (the elliptically polarized light) and for converting the circularly polarized light (the elliptically polarized light) into the linearly polarized light. In this embodiment, since it is necessary to convert the linearly polarized light into the circularly polarized light or the elliptically polarized light, the $\lambda/4$ plate is used. It is necessary to convert the resonant light pair 11 of the linearly polarized light emitted from the LD 2 into the circularly polarized light or the elliptically polarized light with the wave plate 40 and make the resonant light pair 11 incident on the gas cell 5. Consequently, it is possible to improve an S/N of an optical output signal due to the EIT phenomenon with a simple configuration.

Figure 14A:
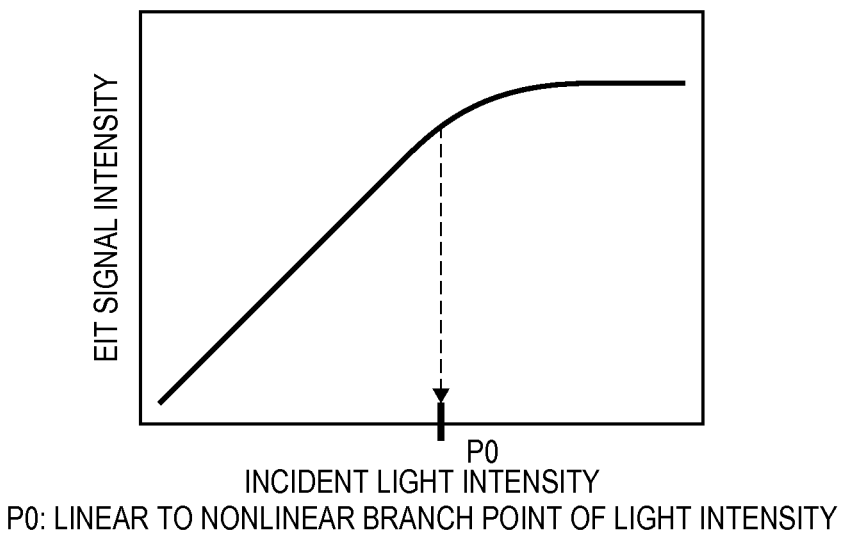
FIG. 14A is a graph of a linear to nonlinear branch point of light intensity.

FIG. 14A is a graph of a relation between light intensity (the abscissa) and EIT signal intensity (the ordinate) of a two-light wave resonant light pair that satisfies a condition for developing EIT. In an area where the light intensity is sufficiently weak, the EIT signal intensity substantially linearly changes while keeping a proportional relation with respect to the light intensity. However, when the light intensity exceeds a certain point (P0), the EIT signal intensity does not change much even if the light intensity is increased (a saturation area). When this point is taken into account and attention is paid to a group (an ensemble) having specific velocity (which indicates a velocity component parallel to incident light as in the past) among alkali metal atoms in a cell, it is desirable in terms of light use efficiency to set incident light intensity to maximum light intensity P0 at which the EIT signal intensity does not saturate with respect to incident light intensity (maximum light intensity in an area in which intensity linearly increases).

Figure 12A:
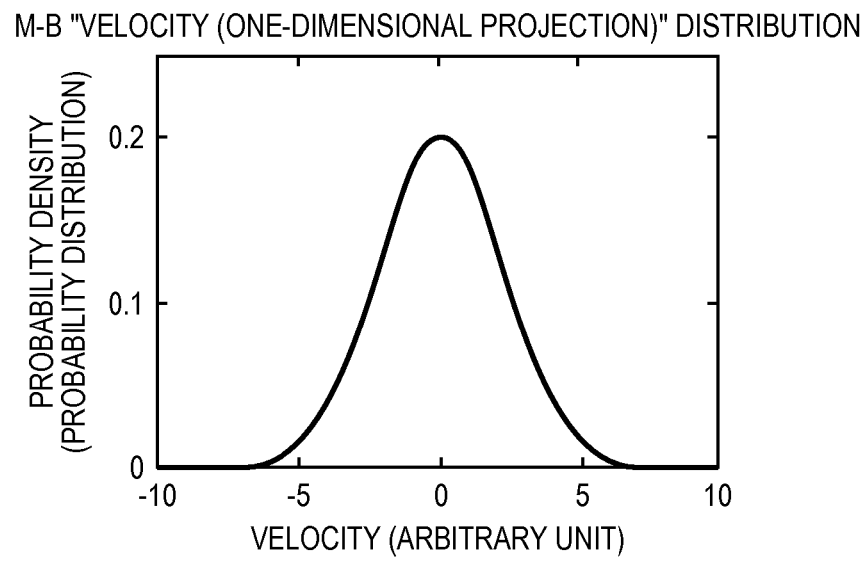
FIG. 12A is a graph of a "velocity (one-dimensional projection" distribution (a Maxwell-Boltzman distribution) of atoms.
Figure 12B:
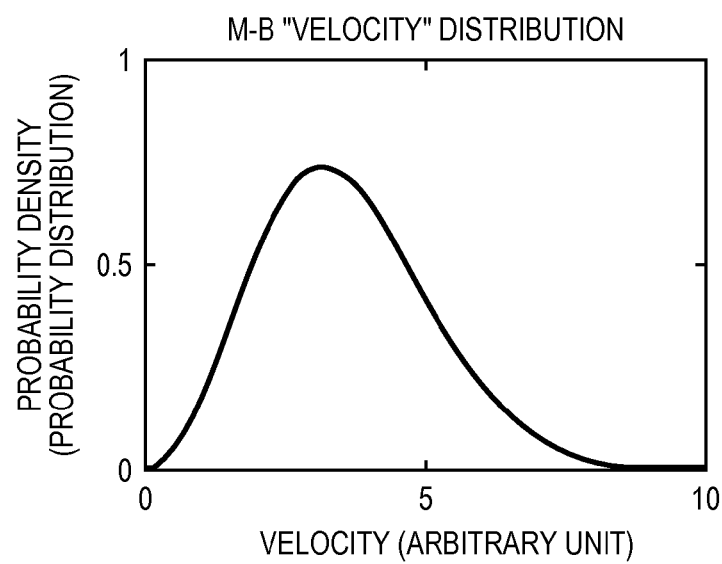
FIG. 12B is a graph of a "speed" distribution (a Maxwell-Boltzman distribution) of atoms.
Figure 14B:
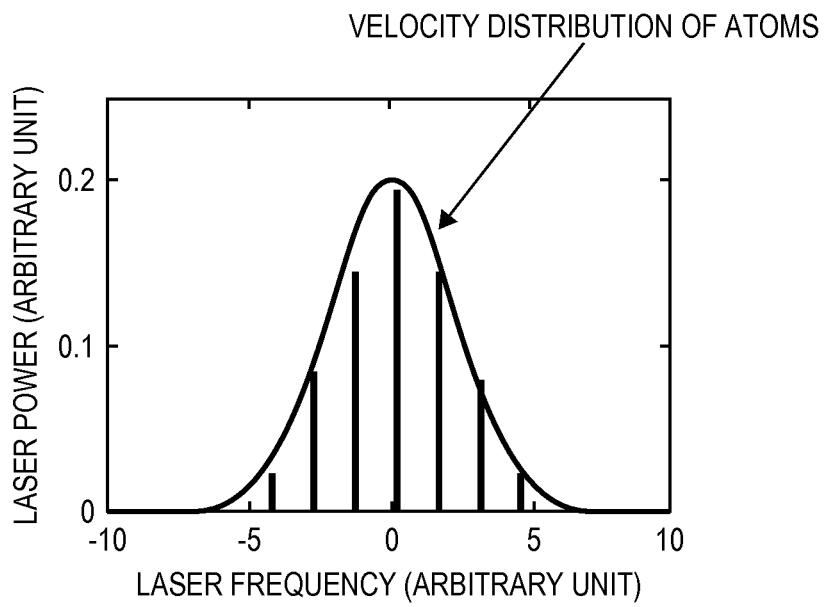
FIG. 14B is a graph of a laser frequency distribution.

An alkali metal atom (e.g., cesium Cs) group in the cell as an EIT development area has a distribution (a profile) of velocity as shown in FIG. 12B. The profile changes because of environmental factors such as pressure and temperature. When attention is paid to a distribution of velocity components only in a fixed direction, the distribution is a substantial Gaussian distribution as shown in FIG. 12A. When a two-light wave resonant light pair is made incident in this system to develop EIT, since Doppler broadening of energy is caused by this velocity distribution, an EIT signal intensity distribution with respect to a center frequency in a frequency domain for EIT development is also the Gaussian distribution (typically having broadening of about 1 [GHz] in terms of frequency). Therefore, when attention is paid to the light use efficiency, if light intensities of the respective plural resonant light pairs are set to be near P0, a distribution of the resonant light pairs has a shape close to a velocity distribution of atoms, i.e., the Gaussian distribution as shown in FIG. 14B.

A semiconductor laser or the like emits, when a DC current is applied thereto, single-color light (coherent light) having a frequency (wavelength) corresponding to a current value (Ivias) of the DC current. When center wavelength is set to about 852 [nm] and "modulation" of 4.6 [GHz] is applied to Ivias (Imod(1)=4.6 [GHz]), sidebands having an interval (4.6×2=9.2 [GHz]) are formed on both sides of the center wavelength. When the two light waves are made incident on Cs atoms in the cell as the resonant light pair, quantum interference is caused and the EIT phenomenon develops. When the Doppler broadening explained above is recalled, it is seen that the number of Cs atoms in the cell contributing to the EIT phenomenon in the resonant light pair (one pair) by the two light waves is extremely small. In other words, EIT development efficiency is low in the past.

Figure 16:
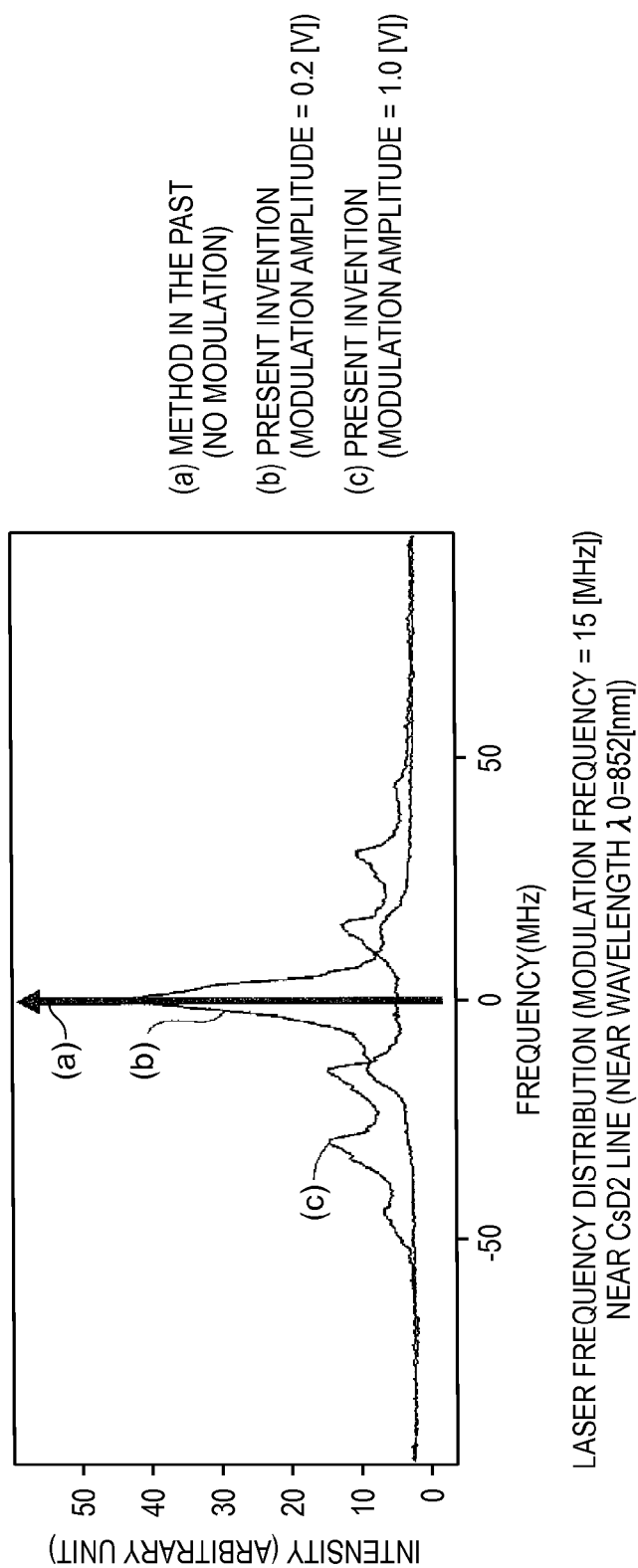
FIG. 16 is a graph of a laser frequency distribution near a CsD2 line.

A state of an applied current for driving the semiconductor laser and a frequency distribution of a laser are explained in detail with reference to the drawings. FIG. 16 is a graph of a frequency distribution observed when frequency modulation is applied to a single-color semiconductor laser beam having center wavelength of about 852 [nm]. To develop EIT with Cs as alkali metal atoms set as target atoms, Ivias (a DC bias current) is set such that a center frequency is set to about 852 [nm] equivalent to excitation energy. Sidebands are generated when frequency modulation Imod(1) of 4.6 [GHz] is applied directly to Ivias or by use of an EOM (an electro-optic modulation element). One resonant light pair by two light waves having a frequency difference of 9.2 GHz can be generated. When modulation Imod(2) of an arbitrary frequency (e.g., 15 [MHz]) is further superimposed on the resonant light pair (superimposed modulation), each of the two light waves is modulated by a superimposed frequency 15 [MHz] and a frequency distribution of a comb tooth shape having intervals of the superimposed frequency [MHz] is generated. Since the resonant light pair can be regarded as plural pairs, if the original two light waves respectively having the frequency distribution of the comb tooth shape are caused to interact with the Cs atoms in the cell, it is possible to develop EIT simultaneously with a CS atom group moving at different velocities. Therefore, EIT development efficiency is remarkably improved (the invention).

(a) of FIG. 16 indicates one of the two light waves not subjected to the superimposed modulation as in the past. (b) and (c) of FIG. 16 indicate spectra obtained when Imod(2) is superimposed as a sine wave. Both modulated frequencies are equal at 15 [MHz] but amplitude conditions for modulation are different in (b) and (c). It is seen that both the spectra show frequency distributions of a comb tooth shape and a range of frequency spread is larger in (c) in which modulation amplitude is 1.0 [V] than in (b) in which modulation amplitude is 0.2 [V].

FIG. 17 is a graph of a relation between intensity (the ordinate) and line width (the abscissa) of an EIT signal of Cs obtained by irradiating plural resonant light pairs according to laser driving with the superimposed modulation Imod(2) of the invention taken into account. The relation is compared with a relation in the method in the past. Data of the graph is acquired by changing laser power irradiated on Cs. (a), (b), and (c) of FIG. 17 respectively correspond to (a), (b), and (c) of FIG. 16. It is seen that, at the same line width, the EIT signal intensity is far larger in the invention compared with the method in the past and the "performance index" (=Q×(S/N)) defined above is improved. In the method of the invention, the EIT signal intensity is larger in (c) than (b). This is understood to be because, as it is seen from the laser spectrum distributions shown in FIG. 16, efficiency of interaction with a resonant light pair is improved by capturing Cs atoms of a larger number of velocity distributions in the cell and the Cs atoms and the resonant light pair can contribute to the EIT development. It was confirmed that, in the method in the past (a), since the EIT signal intensity was not obtained, it was difficult to set the EIT line width to be equal to or smaller than 120 [kHz] and improve a Q value (an inverse of the EIT signal line width) but, in (b) and (c) of the invention, it was possible to further reduce line width and substantially improve the performance index.

FIG. 18 is a graph of comparison of EIT signals at full width at half maximum (line width) of 127 [kHz]. It was confirmed that, the EIT signal intensity was about 14 times as large as that in (a) of the method in the past.

Figure 15A:
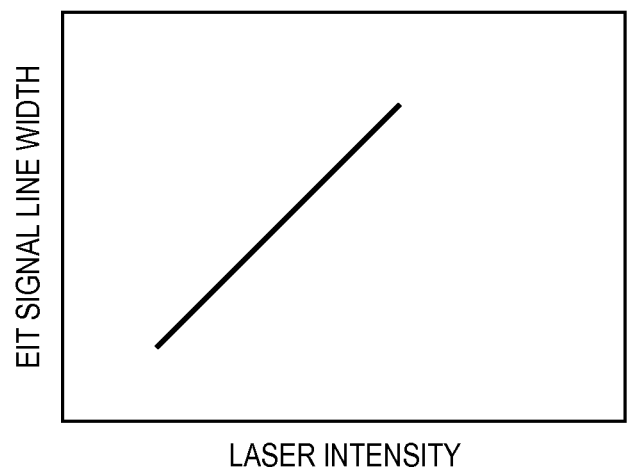
FIG. 15A is a graph of dependency of EIT signal line width on laser intensity.
Figure 15B:
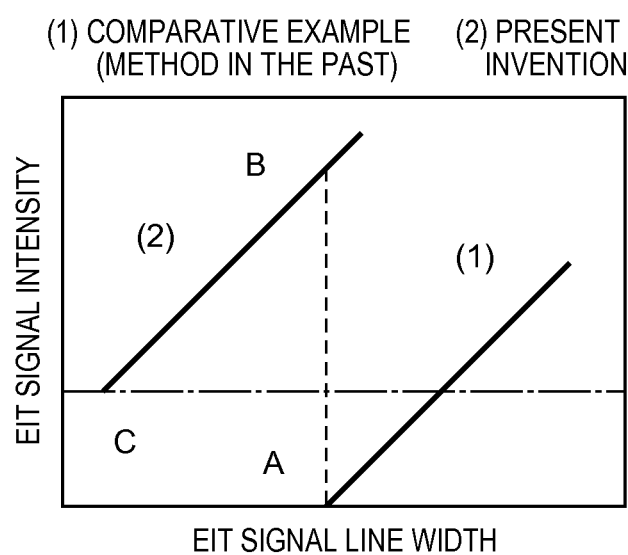
FIG. 15B is a graph of comparison of a method in the past and a method of the invention concerning a relation between EIT signal intensity and the EIT signal line width.

The following points are clarified by summarizing the results obtained above. When laser power is reduced to narrow line width by power broadening (FIG. 15A), the EIT signal intensity weakens in proportion to reduction in the laser power (FIG. 15B). In the method in the past, the EIT signal intensity falls to 0 at a point A. In other words, signal line width narrower than signal line width at the point A cannot be acquired.

However, in the method of the invention, since the number of atoms (density) in the cell contributing to the EIT signal development substantially increases, sufficient signal intensity can be obtained at the EIT signal width at which signal intensity disappears in the method in the past (a point B). In other words, a value obtained by dividing the EIT signal intensity at the point B by the EIT signal intensity at the point A represents a maximum amplification ratio of the method of the invention to the method in the past and is an index of an effect of improvement of the S/N. When the S/N is improved, since the performance index is improved, it is possible to improve, in proportion to a level of the performance index, performance of every device that makes use of the EIT phenomenon. For example, in the atomic oscillator that makes use of the EIT phenomenon, frequency stability is improved in proportion to the S/N. If the atomic oscillator is applied to a quantum interference sensor such as a magnetic sensor (using a characteristic that a frequency of an EIT atomic oscillator changes sensitively in response to an external magnetic field), it is evident that an effect such as an increase in sensitivity is realized. In the invention, since the S/N is improved, signal intensity equivalent to that in the past can be obtained even if the size of the cell that causes the EIT phenomenon is reduced. Therefore, there is an effect that it is possible to further reduce the size of the device.

As shown in FIG. 15B, if sufficient EIT signal intensity is obtained at the point B, it is possible to further narrow the signal line width by further reducing the laser intensity (exclusion of the influence of the power broadening). For example, when a target minimum signal intensity line is indicated by an alternate long and short dash line, in the method of the invention, it is possible to attain signal line width at a point C. As explained above concerning the S/N, as a value of the line width decreases, the Q value increases and, therefore, a value of the performance index increases. Therefore, it is possible to improve performance of every device that makes use of the EIT phenomenon. For example, in the atomic oscillator that makes use of the EIT phenomenon, frequency stability is improved by narrowing the EIT signal line width. If the atomic oscillator is applied to a quantum interference sensor such as a magnetic sensor (using a characteristic that a frequency of an EIT atomic oscillator changes sensitively in response to an external magnetic field), an effect such as an increase in accuracy is realized.

Consequently, according to the invention, it is possible to obtain EIT signal intensity and EIT line width, which cannot be attained by the method in the past, by appropriately selecting a method of modulating a laser. Therefore, there is an advantage that it is possible to extensively determine an EIT signal profile matching a purpose to which the invention is applied. If this advantage is utilized, for example, if means that can control parameters for the laser modulation (a modulated waveform, intensity, and the like including modulation on and off) at stages of EIT device design and manufacturing is independently provided integrally with a laser driving circuit IC or the like and a considerable number of other components are common parts, it is possible to easily manufacture an EIT device exclusively used for a purpose. There is also an effect such as a reduction in cost. Further, means with which a product user can appropriately control and set the laser modulation parameters according to an environment of use or the like may be provided.

Figure 13A:
FIG. 13A is a graph of a harmonic (+ component) distribution during sine wave modulation.
Figure 13C:
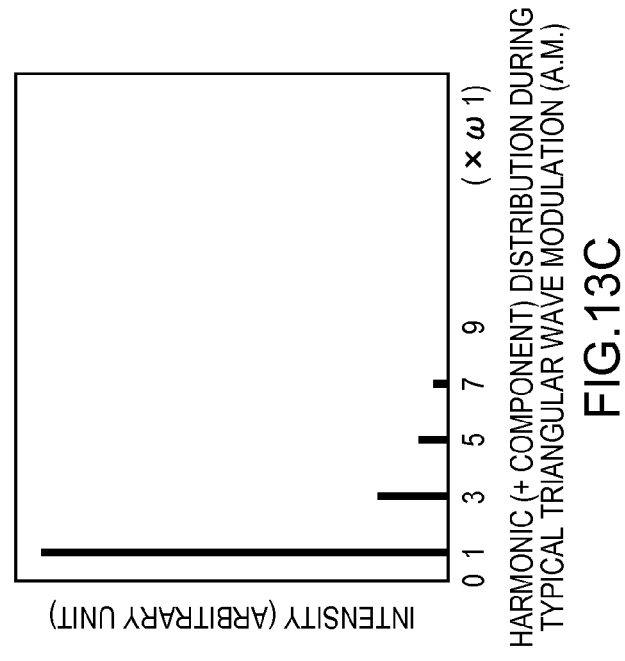
FIG. 13C is a graph of a harmonic (+ component) distribution during typical triangular wave modulation.
Figure 13B:
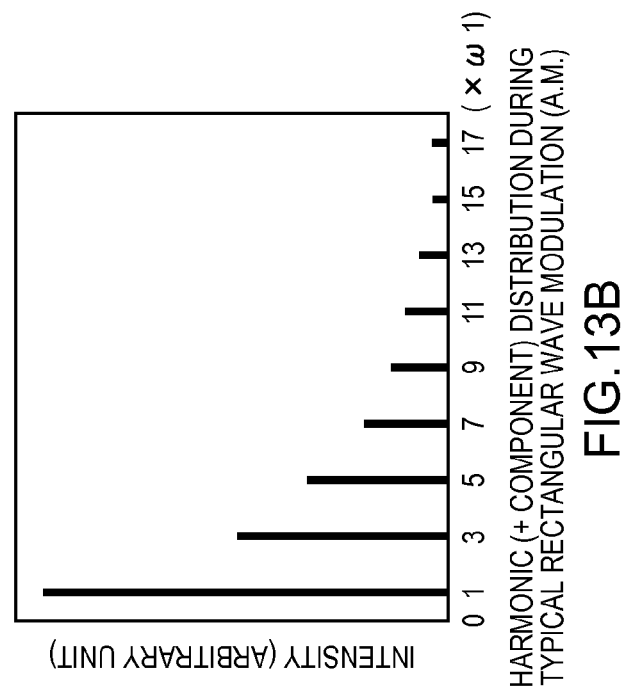
FIG. 13B is a graph of a harmonic (+ component) distribution during typical rectangular wave modulation.

FIGS. 13A to 13C are graphs of a relation between a method of modulating a laser and a Fourier component. In FIG. 13A, a Fourier component obtained in amplitude modulation (AM) by a sine wave is shown. In FIG. 13B, a Fourier component in amplitude modulation (AM) by a rectangular wave is shown. In FIG. 13C, a Fourier component in amplitude modulation (AM) by a triangular wave is shown. The abscissa indicates a frequency. In rectangular wave modulation, a Fourier component relatively higher in order than that in triangular wave modulation is present. If a combined wave of these waves is subjected to superimposed modulation and a laser beam is subjected to superimposed modulation as Imod(2) in frequency modulation (FM) and phase modulation (PM), it is possible to obtain an arbitrary modulated waveform. Therefore, it is possible to control an intensity distribution of plural resonant light pairs and intervals of adjacent frequencies at a high degree of freedom. Consequently, it is possible to realize an effect that it is easy to perform EIT signal control necessary for device performance required for each application and accuracy is improved.

Figure 19:
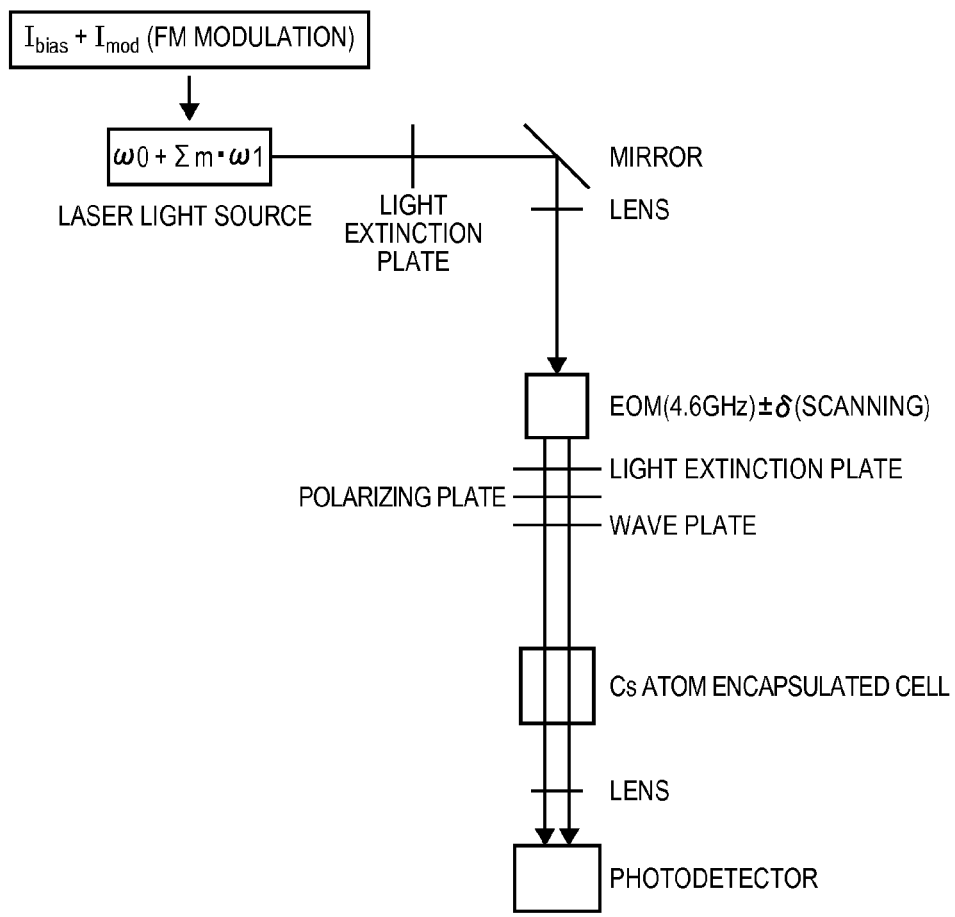
FIG. 19 is a diagram of the configuration of an experiment system.

FIG. 19 is a diagram of the configuration of an experiment system according to the invention. This configuration is an example in which a laser is not modulated in Imod(1) and an EOM (an electro-optical modulation element) is used.

FIGS. 20A to 20C are energy diagrams of an electron state of alkali metal. FIG. 20A is an energy diagram of an excitation level P3/2 and corresponds to a so-called D2 line. FIG. 20B is an energy diagram of an excitation level P1/2 and corresponds to a so-called D1 line. In FIG. 20C, interaction between one resonant light pair by two light waves in the past or plural light pairs of the invention and alkali metal atoms with the Doppler broadening taken into account is shown. FIG. 20C is an energy diagram near an excitation level that satisfies a condition for causing the EIT phenomenon.

The excitation level P3/2 has a hyperfine structure. In a normal operating temperature range of the device using the EIT phenomenon, F'=I+1/2, I−1/2 involved in the EIT development has overlapping energies because of the Doppler broadening. (FIG. 20C). In a high-temperature region, overlapping of energies due to the Doppler broadening may occur in the hyperfine structure of the excitation level P1/2. A laser center frequency (a center wavelength) is set such that excited energy Eend of as many resonant light pairs as possible among the plural resonant light pairs of the invention is made incident in the overlapping region. In other words, as shown in FIG. 20C, the excited energy Eend is set to satisfy E1<Eend<E2. F' represents a quantum number of the hyperfine structure and I represents a nuclear spin quantum number.

One resonant light pair made incident in the energy overlapping region causes the EIT phenomenon for two kinds of alkali metal atoms corresponding to different quantum numbers of the hyperfine structure (F'). In other words, EIT simultaneously occurs in alkali metal atoms in different two kinds of velocity groups (ensembles) having velocity components in opposite directions. When such a condition is satisfied, since light intensity (a photon number) of a resonant light pair is dispersed to the respective ensembles, EIT signal intensity less easily saturates, a stronger laser beam can be irradiated, and the S/N is improved. In particular, the effect is more conspicuous when it is necessary to reduce the size of the cell and enhance the EIT signal intensity. If total light intensity to be irradiated is the same, the photon number is dispersed such that the alkali metal atoms of the different two kinds of velocity groups and photons interact with each other in the overlapping region. As a result, power broadening is suppressed and line width of an EIT signal is narrowed for one velocity group (an increase in the Q value). In other words, it is possible to improve the performance index.

FIG. 21 is an energy diagram of a typical P1/2 level. In general, hyperfine structure energy split width of the D1 line (typically 0.5 to 1 GHz) is large compared with that of the D2 line. Two kinds of energy bands due to the Doppler broadening do not overlap. As explained above, in the case of the D2 line (the excitation end level is P3/2), since the energy split width of the hyperfine structure is small, the energy bands overlap because of the Doppler broadening. Plural resonant light pairs could simultaneously cause interaction with the same atoms. In this case, four-light wave mixing occurs, the pure three-level system Λ type transition fails, and the EIT efficiency falls. However, in general, hyperfine structure energy split width of the D1 line (typically 0.5 to 1 GHz) is large compared with that of the D2 line. Two kinds of energy bands due to the Doppler broadening do not overlap. Therefore, since it is possible to realize EIT by the plural resonant light pairs while maintaining the pure three-level system Λ type transition if the D1 line is used, it is possible to increase the effect of enhancement of the EIT signal due to the superimposition effect. In this case, there are two kinds of methods; a method of setting the excited energy Eend to satisfy E11<Eend<E12 (FIG. 21A) and a method of setting the excited energy Fend to satisfy E21<Eend<E22 (FIG. 21B).

FIG. 22C is a diagram of an arrangement configuration of a cell, in which alkali metal atoms are encapsulated, a light source, an optical path, and a detector according to a sixth embodiment of the invention. Light emitted from the laser light source is made incident on the cell and causes the EIT phenomenon with the alkali metal atoms. Then, the light folded via means such as reflection travels in the opposite direction to cause the EIT phenomenon with the alkali metal atoms in the cell again and is guided to the photodetector. This is a so-called reflection type. As shown in FIGS. 22A and 22B, when energy of an excitation level with Doppler width not taken into account is represented as E10, if excited energy Eend0 of single color light of the light source is selected not to be equal to E10 (E10<Eend0 or Eend0<E10), one resonant light pair can cause, in a forward path and a backward path, EIT with an alkali metal atom group having velocity components in opposite directions in the cell. Therefore, when plural resonant light pairs are configured to cause EIT under such a condition, compared with a type other than the reflection type, the equivalent effect of the invention can be obtained with half the resonant light pairs or half modulation width of light. Therefore, in this configuration, a mechanism for generating plural resonant light pairs of a laser driver or the like is designed more easily and power consumption during device driving is reduced, which contributes to energy saving.

FIG. 23C is a diagram of an arrangement configuration of a cell, in which alkali metal atoms are encapsulated, a light source, an optical path, and a detector according to a seventh embodiment of the invention. Light emitted from the laser light source is made incident on the cell and causes the EIT phenomenon with the alkali metal atoms. Then, the light passes through the cell plural times via means such as reflection, causes the EIT phenomenon every time the light passes through the cell, and is led to the photodetector. This is a so-called multiple reflection type. As shown in FIGS. 23A and 23B, if excited energy Eend of all plural resonant light pairs, which could cause the EIT phenomenon, is selected to satisfy only one of conditions Eend<E10 and E10<Eend, one resonant light pair can cause, in a forward path and a backward path, EIT with an alkali metal atom group having velocity components in opposite directions in the cell. Since optical path length is longer in the multiple reflection type, coherent time increases, intensity of an EIT signal increases, and line width narrows. This leads to improvement of the performance index. When the number of times of reflection of the light is set to an odd number of times and optical path lengths in the forward path and the backward path of the light are set substantially equal, the numbers of atoms contributing to EIT in different velocity groups are substantially equal. This is advantageous in terms of EIT development efficiency. Therefore, when plural resonant light pairs are configured to cause EIT under such a condition, compared with a type other than the reflection type, the equivalent effect can be obtained with half the resonant light pairs or half modulation width of light. Therefore, in this configuration, a mechanism for generating plural resonant light pairs of a laser driver or the like is designed more easily and power consumption during device driving is reduced, which contributes to energy saving.

What is claimed is:

1. A quantum interference device comprising:
    a cell that encapsulates gaseous alkali metal atoms; and
    a light source that supplies a light;
    an electro-optic modulation element in which the light and a mixed signal is input, the light source supplying a resonant light pair to the cell, wherein
    the electro-optic modulation element has first and second modulation elements,
    the resonant light pair includes first and second resonant light pairs,
    the first and second modulation elements generate the first and second resonant light pairs,
    the mixed signal is formed by mixing two frequency signals, and
    center frequencies of the resonant light pair are different from one another.

2. The quantum interference device according to claim 1, further comprising:
    a mixer that generates the mixed signal.

3. The quantum interference device according to claim 2, wherein
    the two frequency signals are input to the mixer, and
    one of the two frequency signals is output from an oscillator having a phase-locked loop circuit.

4. The quantum interference device according to claim 2, wherein
    the two frequency signals are input to the mixer, and
    the two frequency signals are respectively output from oscillators that are different from each other.

5. The quantum interference device according to claim 2, wherein
    the two frequency signals are input to the mixer, and
    the two frequency signals are output from an oscillator having a phase-locked loop circuit.

6. A quantum interference device comprising:
    a cell that encapsulates gaseous alkali metal atoms; and
    a light source that supplies a light; and an electro-optic modulation element in which the light is input, wherein the electro-optic modulation element generates a resonant light pair based on the light, and the electro-optic modulation element supplies the resonant light pair to the cell, the electro-optic modulation element has first and second modulation elements, the resonant light pair includes first and second resonant light pairs, and the first and second modulation elements generate the first and second resonant light pairs.

7. The quantum interference device according to claim 6, wherein the first and second modulation elements are connected in series between the cell and the light source.

* * * * *

UNITED STATES PATENT AND TRADEMARK OFFICE
CERTIFICATE OF CORRECTION

PATENT NO. : 9,507,179 B2
APPLICATION NO. : 14/588624
DATED : November 29, 2016
INVENTOR(S) : Taku Aoyama et al.

Page 1 of 1

It is certified that error appears in the above-identified patent and that said Letters Patent is hereby corrected as shown below:

On the Title Page

Please delete "This patent is subject to a terminal disclaimer."

"(45) Date of Patent: *Nov. 29, 2016" should be --(45) Date of Patent: Nov. 29, 2016--

Signed and Sealed this
Eighth Day of May, 2018

Andrei Iancu
*Director of the United States Patent and Trademark Office*